(12) United States Patent
Hasegawa et al.

(10) Patent No.: US 12,262,573 B2
(45) Date of Patent: *Mar. 25, 2025

(54) PHOTOELECTRIC CONVERSION ELEMENT AND SOLID-STATE IMAGING DEVICE

(71) Applicant: SONY SEMICONDUCTOR SOLUTIONS CORPORATION, Kanagawa (JP)

(72) Inventors: Yuta Hasegawa, Kanagawa (JP); Nobuyuki Matsuzawa, Tokyo (JP); Yoshiaki Obana, Kanagawa (JP); Ichiro Takemura, Kanagawa (JP); Norikazu Nakayama, Kanagawa (JP); Masami Shimokawa, Kanagawa (JP); Tetsuji Yamaguchi, Kanagawa (JP); Iwao Yagi, Kanagawa (JP); Hideaki Mogi, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/201,134

(22) Filed: May 23, 2023

(65) Prior Publication Data

US 2023/0309331 A1 Sep. 28, 2023

Related U.S. Application Data

(63) Continuation of application No. 17/338,373, filed on Jun. 3, 2021, now Pat. No. 11,700,733, which is a
(Continued)

(30) Foreign Application Priority Data

May 29, 2015 (JP) .................................. 2015-110900
Mar. 31, 2016 (JP) .................................. 2016-072197

(51) Int. Cl.
*H10K 39/32* (2023.01)
*H01L 27/146* (2006.01)
(Continued)

(52) U.S. Cl.
CPC ........... *H10K 39/32* (2023.02); *H01L 27/146* (2013.01); *H01L 31/10* (2013.01); *H10K 19/20* (2023.02);
(Continued)

(58) Field of Classification Search
CPC ...... H10K 39/32; H10K 19/20; H10K 85/631; H10K 30/353; H10K 71/164;
(Continued)

(56) References Cited

U.S. PATENT DOCUMENTS 5,350,459 A 9/1994 Suzuki et al.
8,178,384 B1 5/2012 Roscheisen et al.
(Continued)

FOREIGN PATENT DOCUMENTS

CN 101248542 A 8/2008
CN 101800288 A 8/2010
(Continued)

OTHER PUBLICATIONS

Hidsia et al., "High-Color-Brightness Organic Photovoltaic Devices for Energy Harvesting," The Japan Society of Applied Physics, The 60th JSAP Spring Meeting 2013, No. 27p-G18-3, Mar. 27-30, 2013, retrieved from https://confit.atlas.jp/guide/event-img/jsap2013s/27p-G18-3/public/pdf?type=in (no translation available), 1 page.
(Continued)

*Primary Examiner* — Andres Munoz
*Assistant Examiner* — Neil R Prasad
(74) *Attorney, Agent, or Firm* — Sheridan Ross PC

(57) ABSTRACT

A photoelectric conversion element according to an embodiment of the present disclosure includes: a first electrode and
(Continued)

a second electrode facing each other; and a photoelectric conversion layer provided between the first electrode and the second electrode, and including a first organic semiconductor material, a second organic semiconductor material, and a third organic semiconductor material that have mother skeletons different from one another. The first organic semiconductor material is one of fullerenes and fullerene derivatives. The second organic semiconductor material in a form of a single-layer film has a higher linear absorption coefficient of a maximal light absorption wavelength in a visible light region than a single-layer film of the first organic semiconductor material and a single-layer film of the third organic semiconductor material. The third organic semiconductor material has a value equal to or higher than a HOMO level of the second organic semiconductor material.

24 Claims, 11 Drawing Sheets

Related U.S. Application Data continuation of application No. 16/503,150, filed on Jul. 3, 2019, now Pat. No. 11,056,539, which is a continuation of application No. 15/575,086, filed as application No. PCT/JP2016/064887 on May 19, 2016, now Pat. No. 10,374,015.

(51) Int. Cl.
  H01L 31/10      (2006.01)
  H10K 19/20      (2023.01)
  H10K 30/30      (2023.01)
  H10K 71/16      (2023.01)
  H10K 85/60      (2023.01)
  H10K 85/20      (2023.01)
  H10K 85/30      (2023.01)

(52) U.S. Cl.
  CPC ........ *H10K 30/353* (2023.02); *H10K 71/164* (2023.02); *H10K 85/631* (2023.02); *H01L 27/14647* (2013.01); *H01L 27/14689* (2013.01); *H10K 30/30* (2023.02); *H10K 85/211* (2023.02); *H10K 85/215* (2023.02); *H10K 85/322* (2023.02); *H10K 85/622* (2023.02); *H10K 85/626* (2023.02); *H10K 85/633* (2023.02); *H10K 85/6572* (2023.02); *H10K 85/6576* (2023.02); *Y02E 10/549* (2013.01)

(58) Field of Classification Search
  CPC .... H10K 85/322; H10K 85/633; H10K 30/30; H10K 85/622; H10K 85/215; H10K 85/211; H10K 85/6576; H10K 85/626; H10K 85/6572; H01L 27/146; H01L 31/10; H01L 27/14647; H01L 27/14689; Y02E 10/549
  See application file for complete search history.

(56) References Cited

U.S. PATENT DOCUMENTS

| | | | |
|---|---|---|---|
| 10,374,015 B2 | 8/2019 | Hasegawa et al. | |
| 11,056,539 B2 | 7/2021 | Hasegawa et al. | |
| 11,700,733 B2 * | 7/2023 | Hasegawa ............ | H10K 85/631 257/40 |
| 2009/0283758 A1 | 11/2009 | Nomura | |
| 2010/0006830 A1 | 1/2010 | Hong | |
| 2012/0032121 A1 | 2/2012 | Higashimura et al. | |
| 2014/0001455 A1 | 1/2014 | Holmes et al. | |
| 2014/0346466 A1 | 11/2014 | Lee et al. | |
| 2014/0353651 A1 | 12/2014 | Takimoto et al. | |
| 2015/0118788 A1 | 4/2015 | Bender et al. | |
| 2021/0320149 A1 | 10/2021 | Hasegawa et al. | |

FOREIGN PATENT DOCUMENTS

| | | |
|---|---|---|
| CN | 103380506 A | 10/2013 |
| CN | 103403908 A | 11/2013 |
| CN | 103811518 A | 5/2014 |
| CN | 202010730929.5 | 5/2016 |
| CN | 202010731230.0 | 5/2016 |
| CN | 107615504 B | 7/2020 |
| CN | 112002806 A | 11/2020 |
| CN | 112002807 A | 11/2020 |
| CN | 112002808 A | 11/2020 |
| CN | 112002809 A | 11/2020 |
| CN | 112002810 A | 11/2020 |
| EP | 2348556 | 7/2011 |
| JP | H06177410 A | 6/1994 |
| JP | 2003-234460 | 8/2003 |
| JP | 2005-303266 | 10/2005 |
| JP | 2007-180190 | 7/2007 |
| JP | 2009-252768 | 10/2009 |
| JP | 2009-538529 | 11/2009 |
| JP | 2009267372 A | 11/2009 |
| JP | 2009538529 A | 11/2009 |
| JP | 2010-067642 | 3/2010 |
| JP | 2010067642 A | 3/2010 |
| JP | 2010232413 A | 10/2010 |
| JP | 2011253861 A | 12/2011 |
| JP | 2012-209496 | 10/2012 |
| JP | 2013-135122 | 7/2013 |
| JP | 2015-015462 | 1/2015 |
| JP | 2015-515749 | 5/2015 |
| KR | 20090042881 A | 5/2009 |
| KR | 10-2014-0127210 | 11/2014 |
| KR | 20140127210 A | 11/2014 |
| TW | 201105633 | 2/2011 |
| TW | 201113265 | 4/2011 |
| TW | 201212215 | 3/2012 |
| TW | 201229046 | 7/2012 |
| TW | 201229087 | 7/2012 |
| TW | 201421718 | 6/2014 |
| TW | 201424023 | 6/2014 |
| TW | 201446738 | 12/2014 |
| TW | 201513330 | 4/2015 |
| TW | 201513421 A | 4/2015 |
| WO | WO-2011052341 A1 | 5/2011 |
| WO | WO 2012/117860 | 9/2012 |
| WO | WO-2013066453 A1 | 5/2013 |
| WO | WO-2014055976 A1 | 4/2014 |
| WO | WO 2014/073446 | 5/2014 |
| WO | WO-2014073446 A1 | 5/2014 |

OTHER PUBLICATIONS

Honda et al., "Multi-colored dye sensitization of polymer/fullerene bulk heterojunction solar cells," Chem. Commun., vol. 46, 2010, pp. 6596-6598.

Lessard et al., "Bis(tri-n-hexylsilyl oxide) Silicon Phthalocyanine: a Unique Additive in Ternary Bulk Heterojunction Organic Photovoltaic Devices," ACS Applied Materials & Interfaces, vol. 6, 2014, pp. 15040-15051.

International Search Report and Written Opinion for International (PCT) Patent Application No. PCT/JP2016/064887, dated Aug. 9, 2016, 9 pages.

Extended European Search Report for European Patent Application No. 16803065.8, dated Dec. 19, 2018, 8 pages.

Official Action (with English translation) for Chinese Patent Application No. 201680029802.2, dated Aug. 29, 2019, 14 pages.

Official Action (no English translation available) for Japanese Patent Application No. 2017-521799, dated Feb. 25, 2020, 4 pages.

Official Action for U.S. Appl. No. 15/575,086, dated Nov. 30, 2018, 10 pages.

Notice of Allowance for U.S. Appl. No. 15/575,086, dated Mar. 27, 2019, 7 pages.

(56) References Cited

OTHER PUBLICATIONS

Corrected Notice of Allowance for U.S. Appl. No. 15/575,086, dated May 17, 2019, 2 pages.
Official Action for U.S. Appl. No. 16/503,150, dated Jan. 10, 2020, 6 pages.
Notice of Allowance for U.S. Appl. No. 16/503,150, dated Mar. 3, 2021, 7 pages.
Official Action for U.S. Appl. No. 17/338,373, dated Oct. 28, 2022, 6 pages.
Notice of Allowance for U.S. Appl. No. 17/338,373, dated Feb. 27, 2023, 7 pages.
Corrected Notice of Allowance for U.S. Appl. No. 17/338,373, dated Mar. 22, 2023, 2 pages.
Corrected Notice of Allowance for U.S. Appl. No. 17/338,373, dated Apr. 12, 2023, 2 pages.

\* cited by examiner

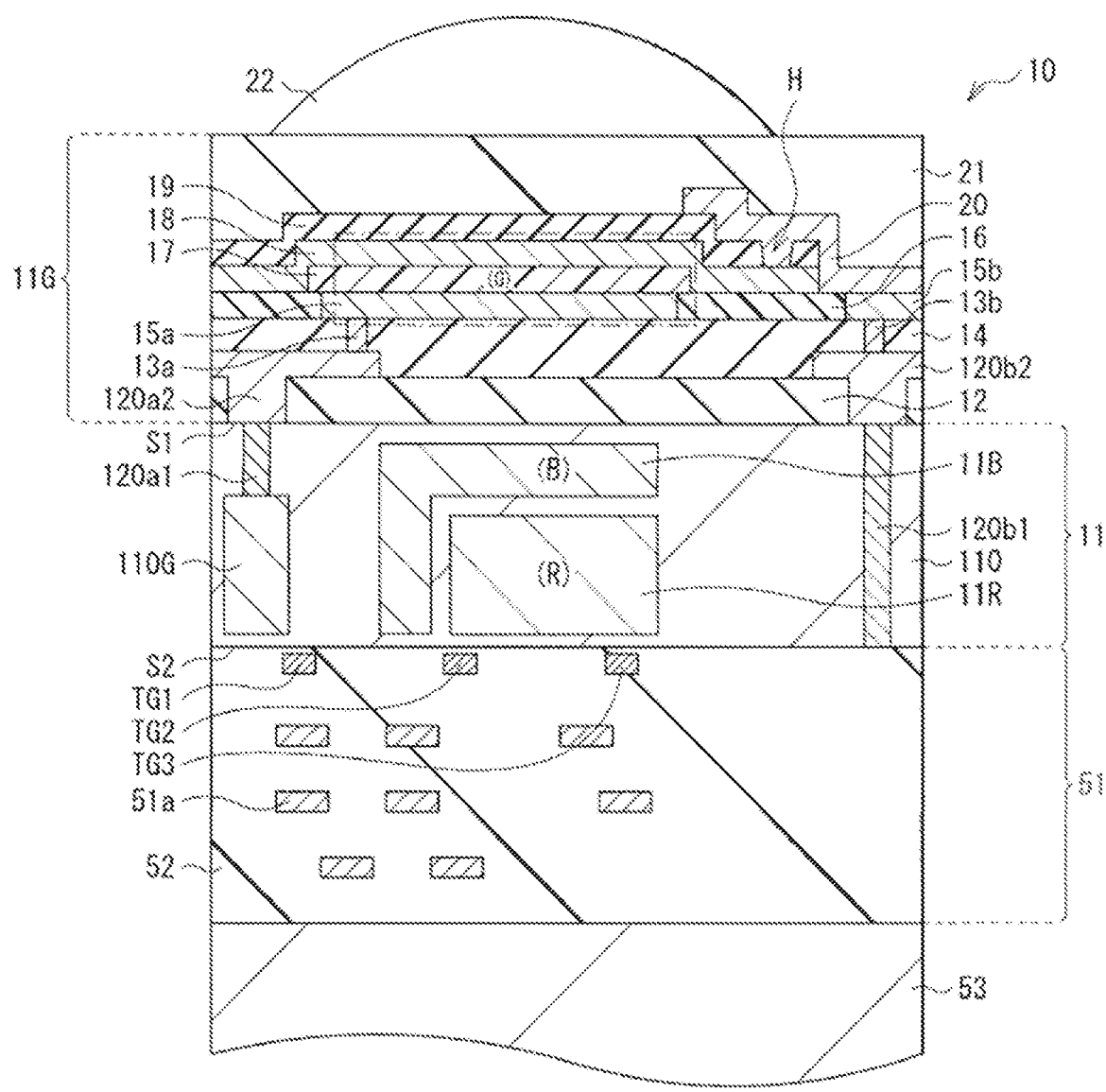

[FIG. 2]
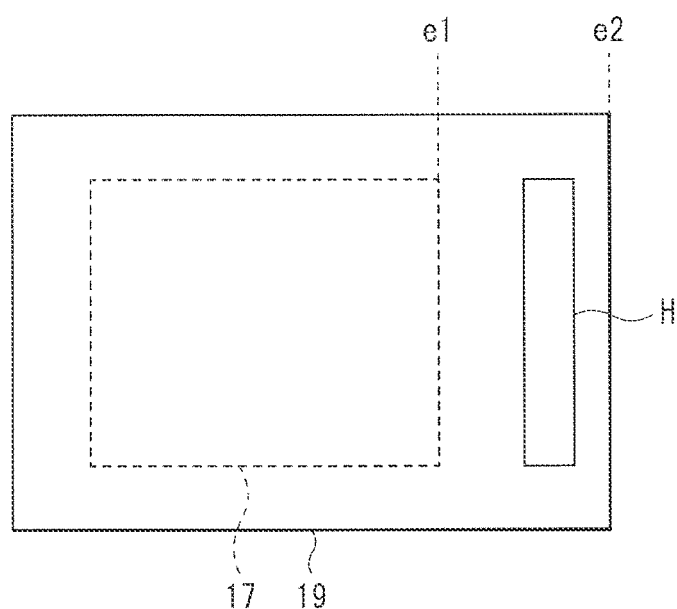

[ FIG. 3A ]
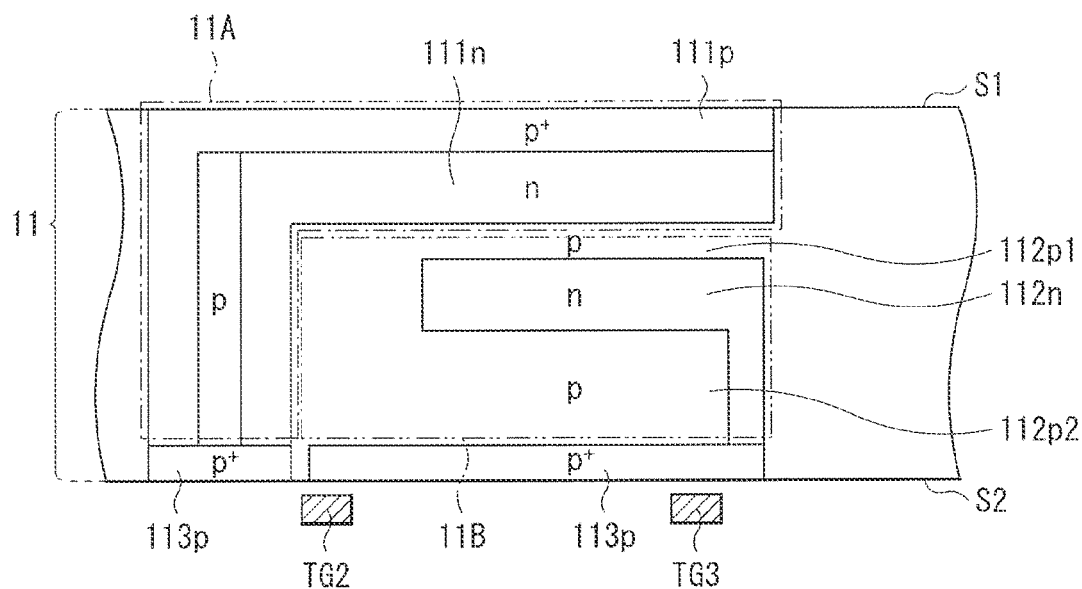
[ FIG. 3B ]
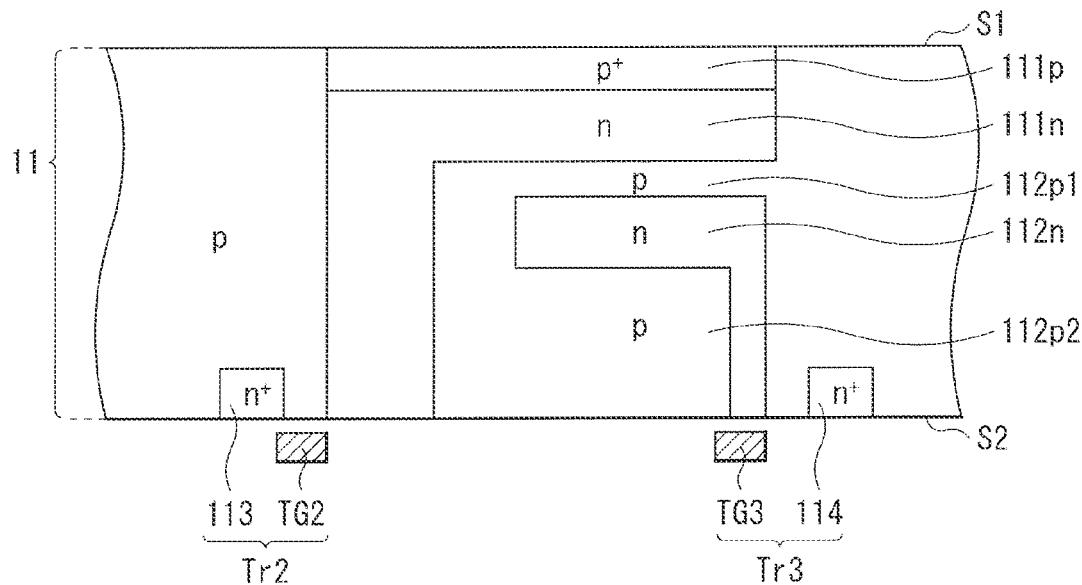

[FIG. 4]
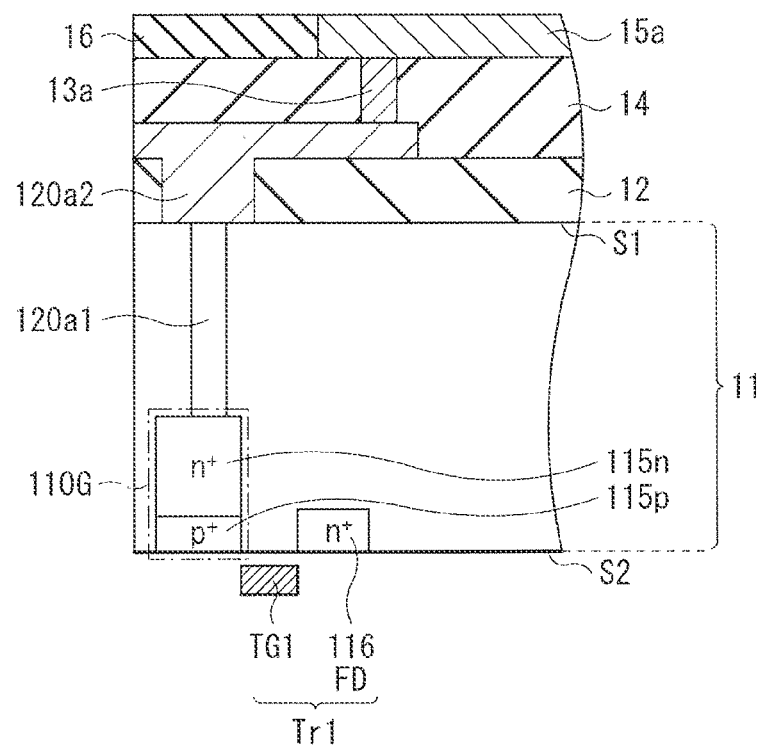

[ FIG. 5A ]
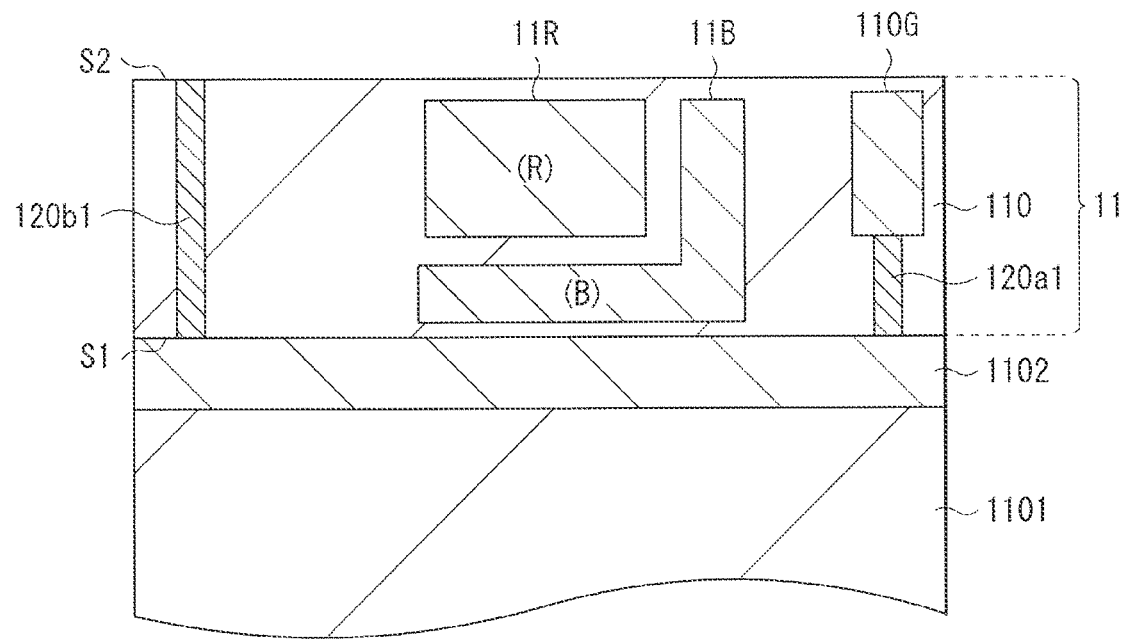
[ FIG. 5B ]
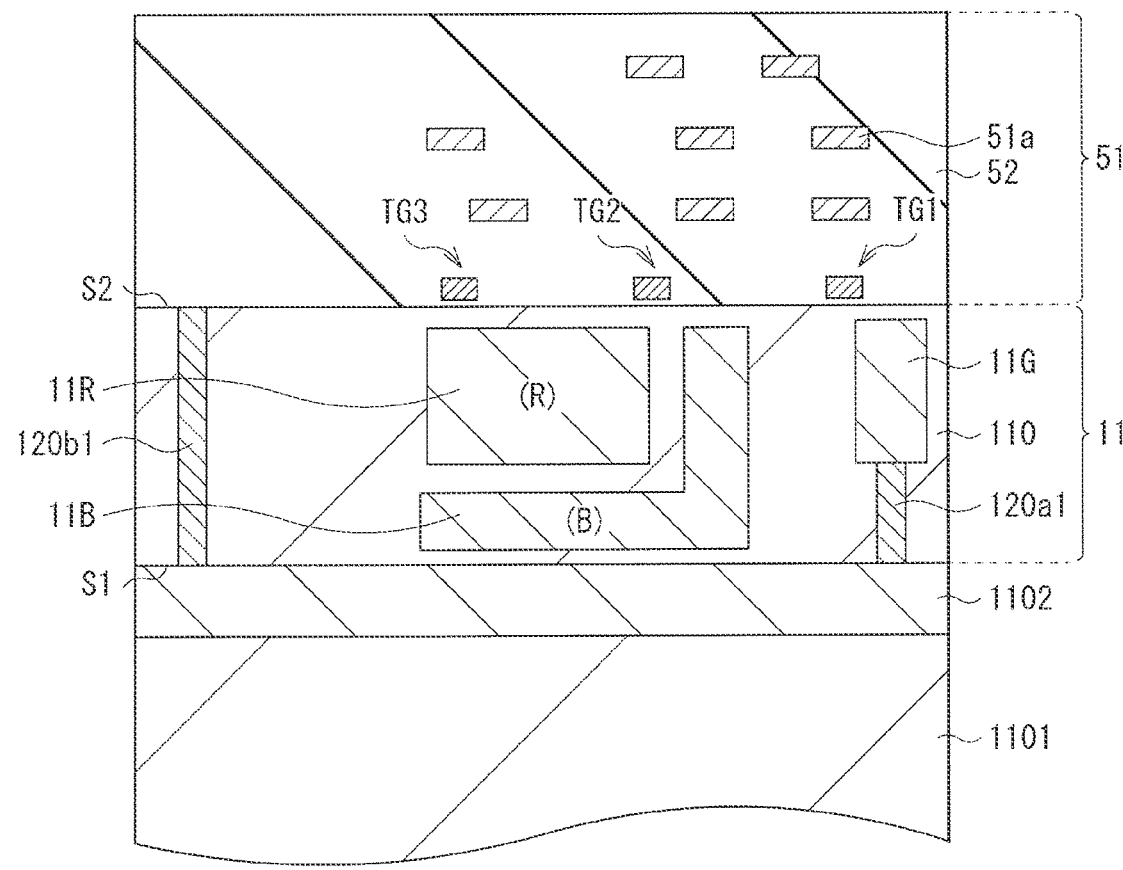

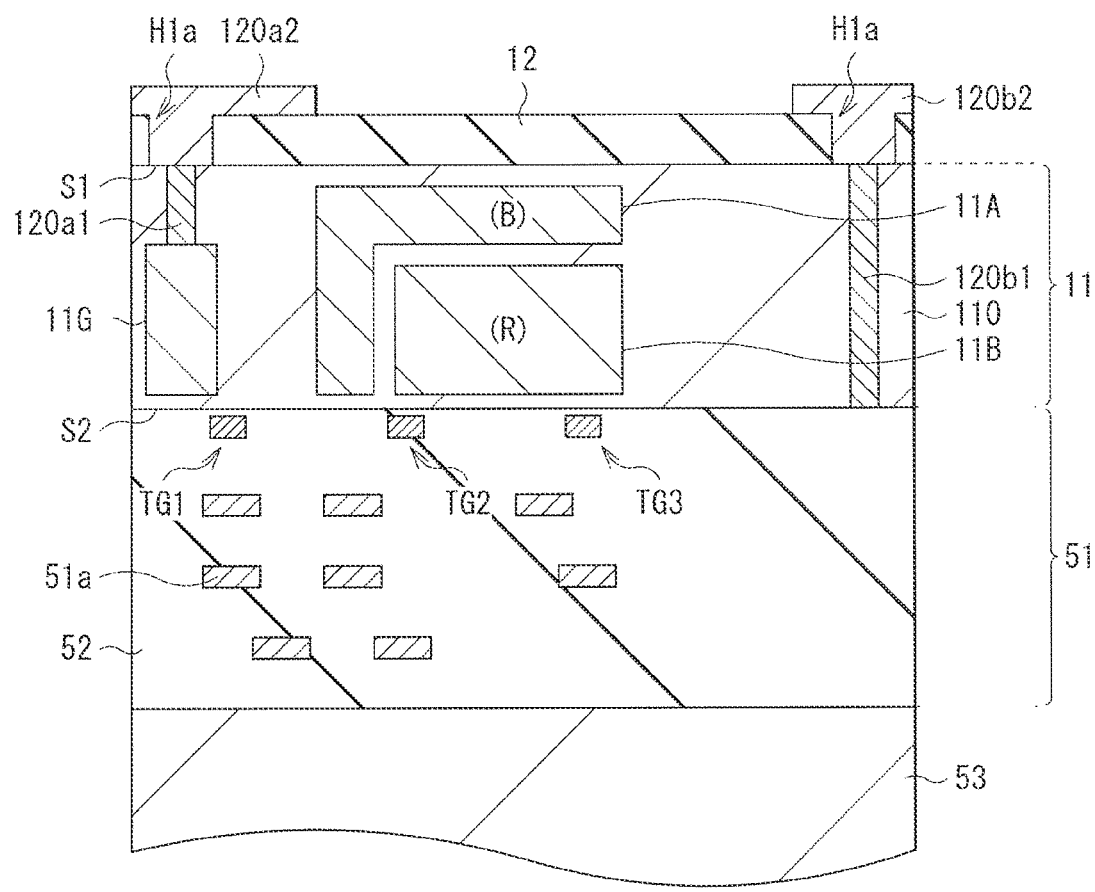
[ FIG. 6A ]

[ FIG. 6B ]
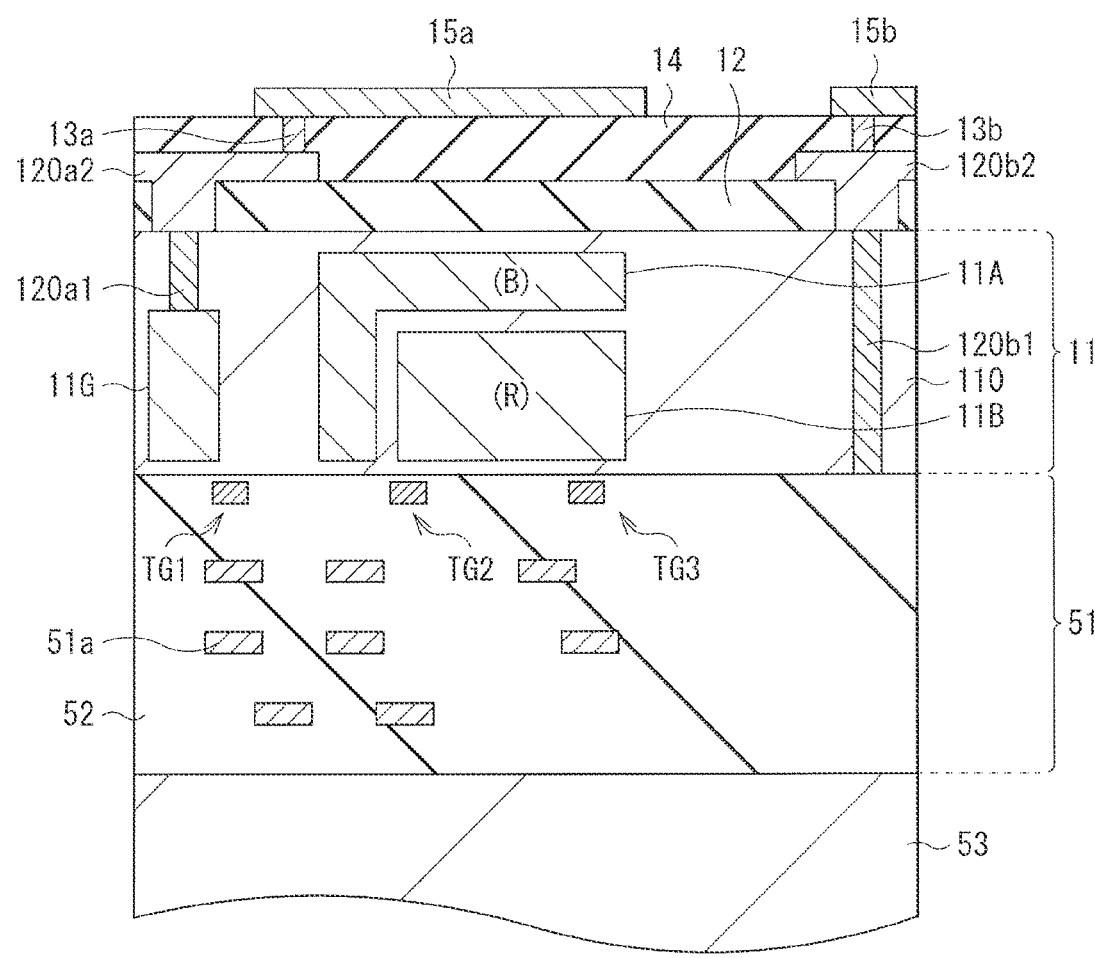

[ FIG. 7A ]
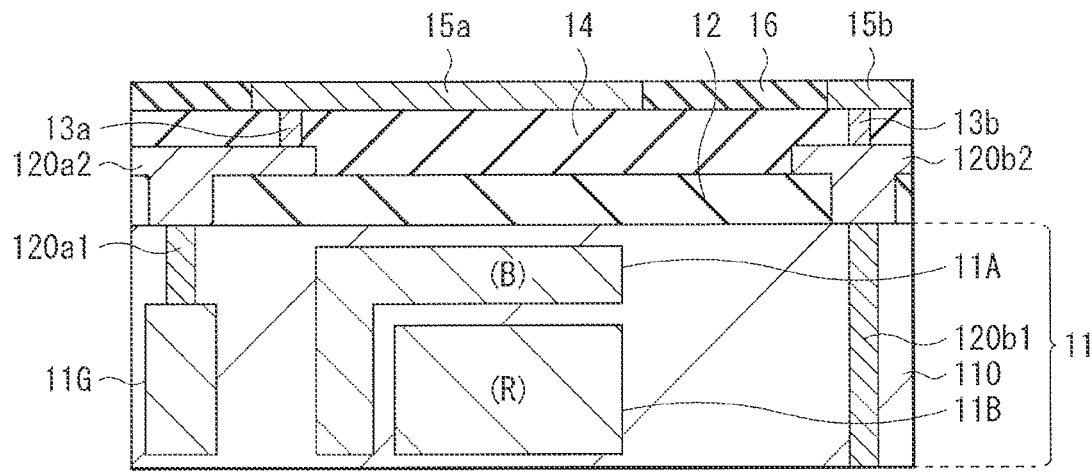
[ FIG. 7B ]
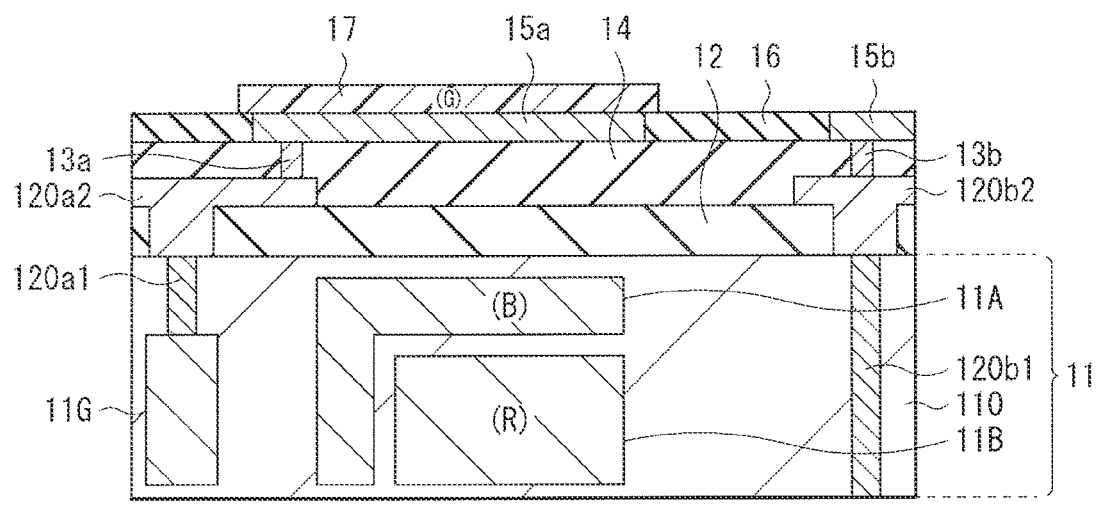
[ FIG. 7C ]
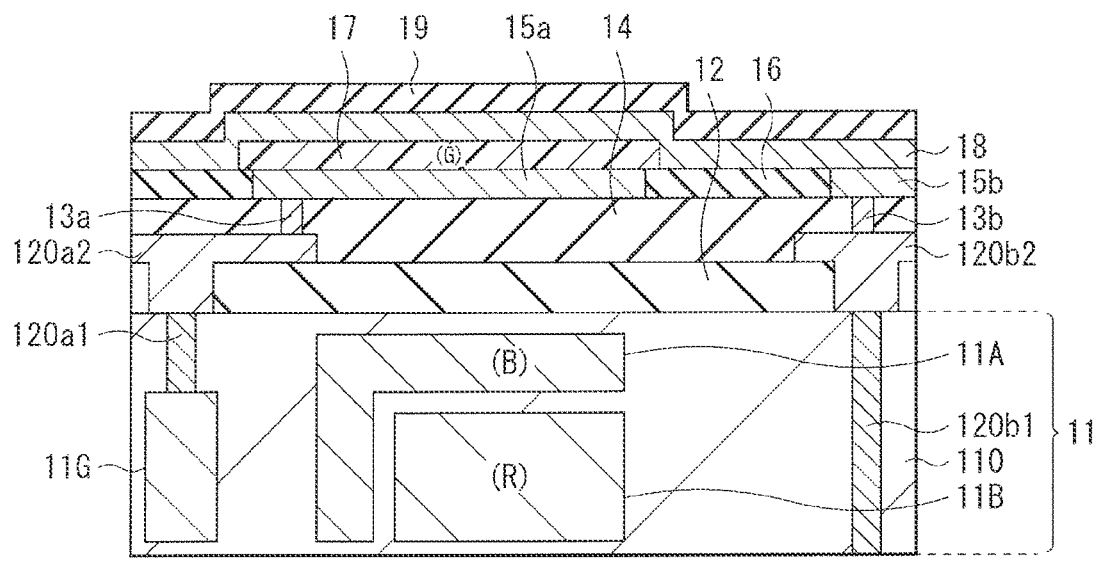

[ FIG. 8 ]
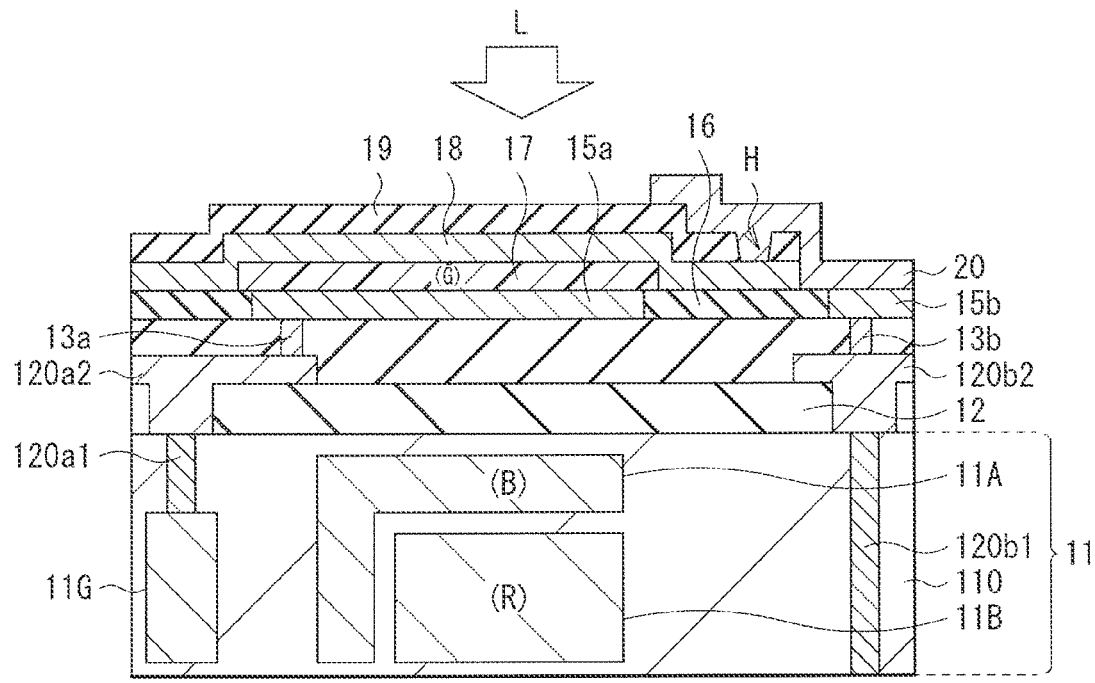
[ FIG. 9 ]
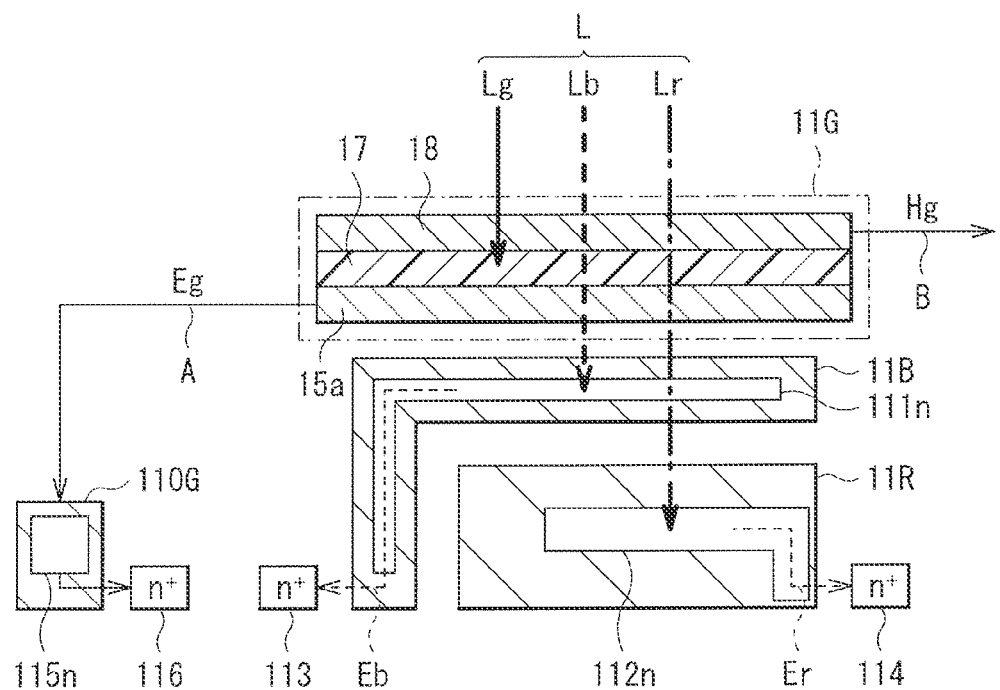

[ FIG. 10 ]
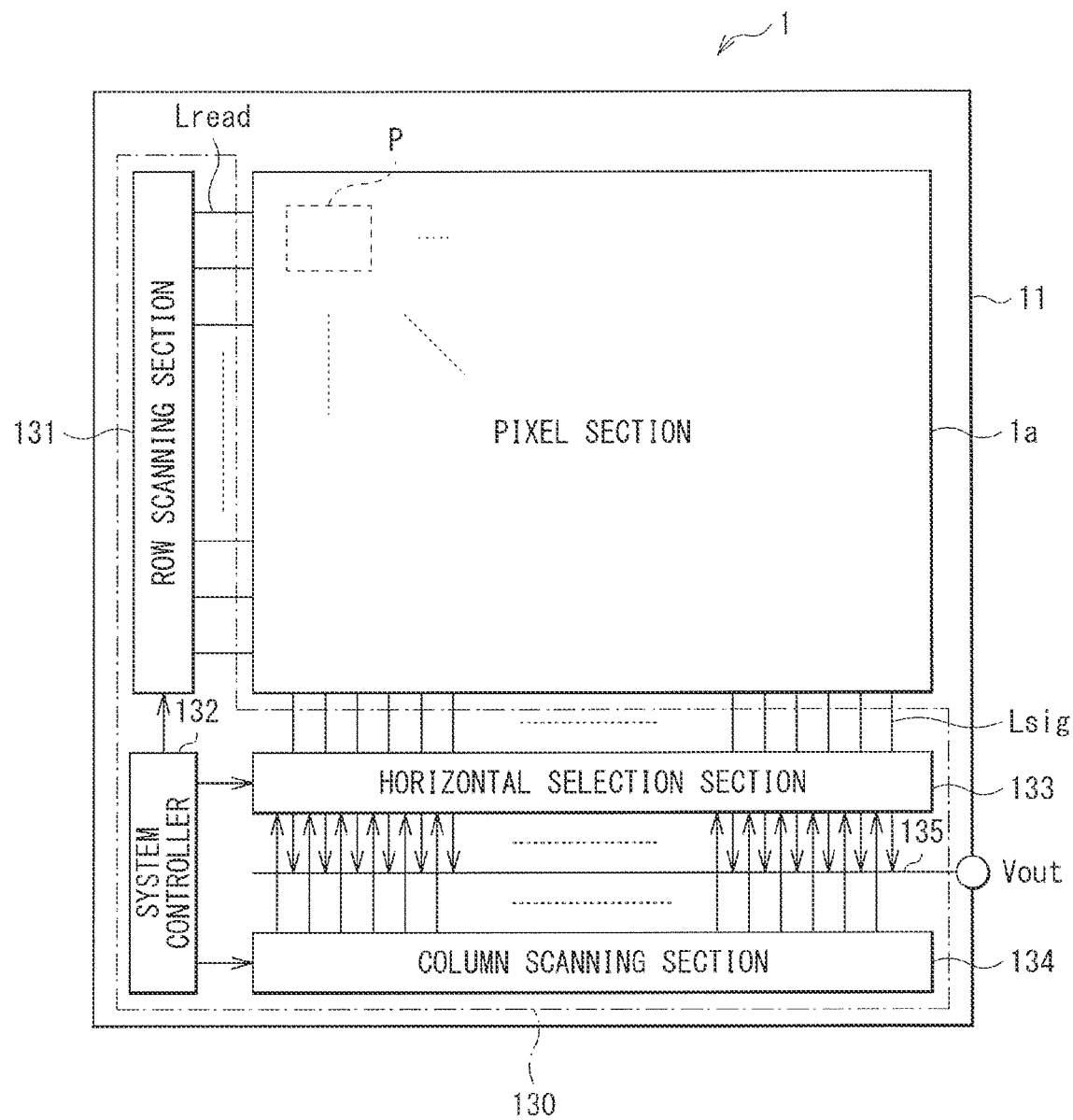

[ FIG. 11 ]
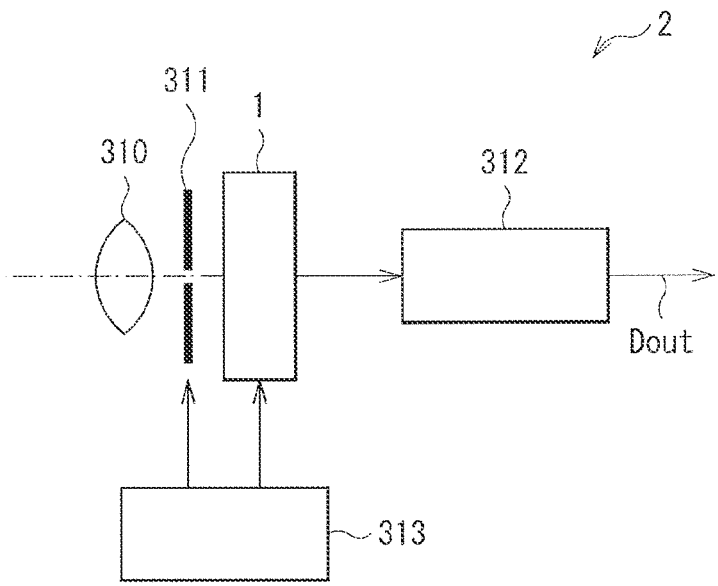
[ FIG. 12 ]
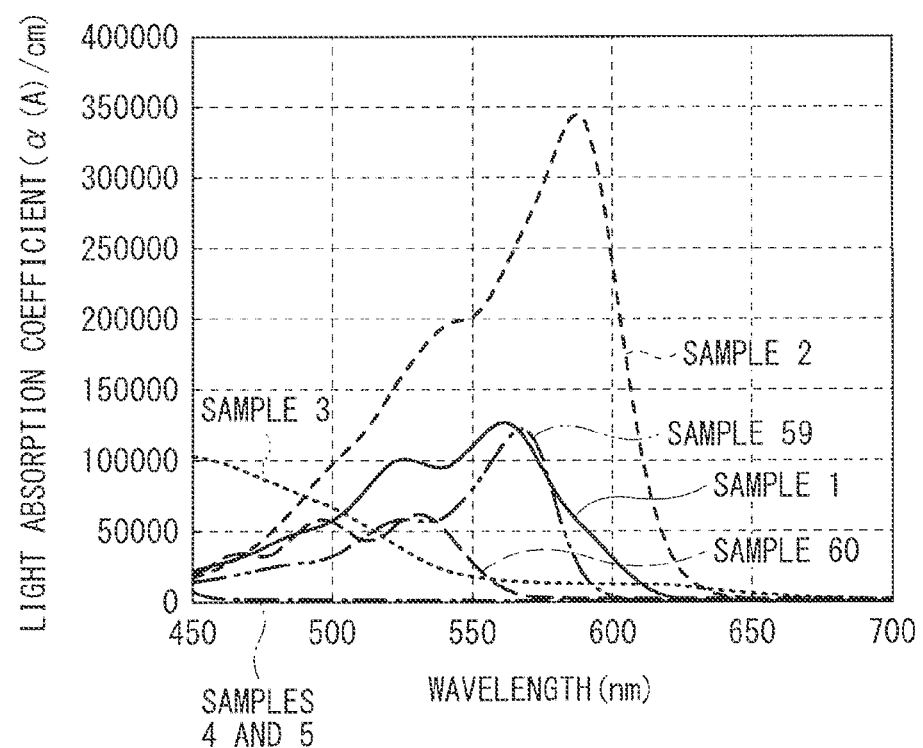

PHOTOELECTRIC CONVERSION ELEMENT AND SOLID-STATE IMAGING DEVICE

CROSS REFERENCE TO RELATED APPLICATIONS

This application is a continuation of U.S. patent application Ser. No. 17/338,373, filed Jun. 3, 2021, which is a continuation of U.S. patent application Ser. No. 16/503,150, filed Jul. 3, 2019, now U.S. Pat. No. 11,056,539, which is a continuation of U.S. patent application Ser. No. 15/575,086, filed Nov. 17, 2017, now U.S. Pat. No. 10,374,015, which is a national stage application under 35 U.S.C. 371 and claims the benefit of PCT Application No. PCT/JP2016/064887 having an international filing date of May 19, 2016, which designated the United States, which PCT application claimed the benefit of Japanese Patent Application No. 2015-110900 filed May 29, 2015, and Japanese Patent Application No. 2016-072197 filed Mar. 31, 2016, the disclosures of which are incorporated herein by reference in their entirety.

TECHNICAL FIELD

The present disclosure relates to a photoelectric conversion element using, for example, an organic semiconductor and a solid-state imaging device including the same.

BACKGROUND ART

In recent years, in solid-state imaging devices such as CCD (Charge Coupled Device) image sensors and CMOS (Complementary Metal Oxide Semiconductor) image sensors, reduction in pixel size has accelerated. The reduction in pixel size reduces the number of photons entering a unit pixel, which results in reduction in sensitivity and reduction in S/N ratio. Moreover, in a case where a color filter including a two-dimensional array of primary-color filters of red, green, and blue is used for colorization, in a red pixel, green light and blue light are absorbed by the color filter, which causes reduction in sensitivity. Further, in order to generate each color signal, interpolation of pixels is performed, which causes so-called false color.

Accordingly, for example, PTL 1 discloses an image sensor using an organic photoelectric conversion film having a multilayer configuration in which an organic photoelectric conversion film having sensitivity to blue light (B), an organic photoelectric conversion film having sensitivity to green light (G), and an organic photoelectric conversion film having sensitivity to red light (R) are stacked in order. In the image sensor, signals of B, G, and R are separately extracted from one pixel to achieve an improvement in sensitivity. PTL 2 discloses an imaging element in which an organic photoelectric conversion film configured of a single layer is formed, and a signal of one color is extracted from the organic photoelectric conversion film and signals of two colors are extracted by silicon (Si) bulk spectroscopy.

CITATION LIST

Patent Literature

PTL 1: Japanese Unexamined Patent Application Publication No. 2003-234460
PTL 2: Japanese Unexamined Patent Application Publication No. 2005-303266

SUMMARY OF THE INVENTION

In the imaging element disclosed in PTL 2, most of incident light is subjected to photoelectric conversion and is read, which results in visible light use efficiency of nearly 100%. Moreover, each light receiver obtains color signals of three colors R, G, and B, which makes it possible to generate an image having high sensitivity and high resolution (invisible false color). Accordingly, such a stacked imaging element is desired to have a superior spectroscopic shape. In addition, the stacked imaging element is desired to achieve fast response time (high responsivity) necessary for rising or falling of a photocurrent in association with turning on or off of light, and an improvement in high external quantum efficiency (EQE). However, in a case where one or two characteristics of the spectroscopic shape, responsivity, and EQE are improved, there is an issue that the other characteristics are deteriorated.

It is desirable to provide a photoelectric conversion element and a solid-state imaging device that each make it possible to achieve a superior spectroscopic shape, high responsivity, and high external quantum efficiency.

A photoelectric conversion element according to an embodiment of the present disclosure includes: a first electrode and a second electrode facing each other; and a photoelectric conversion layer provided between the first electrode and the second electrode, and including a first organic semiconductor material, a second organic semiconductor material, and a third organic semiconductor material that have mother skeletons different from one another. The first organic semiconductor material is one of fullerenes and fullerene derivatives. The second organic semiconductor material in a form of a single-layer film has a higher linear absorption coefficient of a maximal light absorption wavelength in a visible light region than a single-layer film of the first organic semiconductor material and a single-layer film of the third organic semiconductor material. The third organic semiconductor material has a value equal to or higher than a HOMO level of the second organic semiconductor material.

A solid-state imaging device according to an embodiment of the present disclosure includes pixels each including one or more organic photoelectric converters, and includes the photoelectric conversion element according to the foregoing embodiment of the present disclosure as each of the organic photoelectric converter.

In the photoelectric conversion element according to the embodiment of the present disclosure and the solid-state imaging device according to the embodiment of the present disclosure, the photoelectric conversion layer provided between the first electrode and the second electrode facing each other is formed with use of the first organic semiconductor material, the second organic semiconductor material, and the third organic semiconductor material that have mother skeletons different from one another, which improves hole mobility and electron mobility in the photoelectric conversion layer while maintaining a sharp spectroscopic shape. Moreover, electric charge transport efficiency after separation of excitons generated through light absorption into electric charges is improved.

Herein, the first organic semiconductor material is one of fullerenes and fullerene derivatives. The second organic semiconductor material is an organic semiconductor material in a form of a single-layer film having a higher linear absorption coefficient of the maximal light absorption wavelength in the visible light region than the single-layer film of the first organic semiconductor material and the single-layer film of the third organic semiconductor material. The third organic semiconductor material is an organic semiconductor material having a value equal to or higher than the HOMO level of the second organic semiconductor material.

According to the photoelectric conversion element of the embodiment of the present disclosure and the solid-state imaging device of the embodiment of the present disclosure, the photoelectric conversion layer is formed with use of the first organic semiconductor material, the second organic semiconductor material, and the third organic semiconductor material that have mother skeletons different from one another. This makes it possible to improve hole mobility and electron mobility in the photoelectric conversion layer while maintaining a sharp spectroscopic shape, thereby improving responsivity. Moreover, electric charge transport efficiency after separation of excitons generated through light absorption into electric charges is improved, which makes it possible to improve external quantum efficiency. In other words, it is possible to provide a photoelectric conversion element having a superior spectroscopic shape, high responsivity, and high EQE, and a solid-state imaging device including the photoelectric conversion element.

Note that effects described herein are non-limiting. An effect to be achieved by the present disclosure may be any of effects described in the present disclosure.

BRIEF DESCRIPTION OF THE DRAWINGS

FIG. 1 is a cross-sectional view of a schematic configuration of a photoelectric conversion element according to an embodiment of the present disclosure.

FIG. 2 is a plan view of a relationship among forming positions of an organic photoelectric conversion layer, a protective film (an upper electrode), and a contact hole.

FIG. 3A is a cross-sectional view of a configuration example of an inorganic photoelectric converter.

FIG. 3B is another cross-sectional view of the inorganic photoelectric converter illustrated in FIG. 3A.

FIG. 4 is a cross-sectional view of a configuration (lower-side electron extraction) of an electric charge (electron) storage layer of the organic photoelectric converter.

FIG. 5A is a cross-sectional view for description of a method of manufacturing the photoelectric conversion element illustrated in FIG. 1.

FIG. 5B is a cross-sectional view of a process subsequent to the process in FIG. 5A.

FIG. 6A is a cross-sectional view of a process subsequent to the process in FIG. 5B.

FIG. 6B is a cross-sectional view of a process subsequent to the process in FIG. 6A.

FIG. 7A is a cross-sectional view of a process subsequent to the process in FIG. 6B.

FIG. 7B is a cross-sectional view of a process subsequent to the process in FIG. 7A.

FIG. 7C is a cross-sectional view of a process subsequent to the process in FIG. 7B.

FIG. 8 is a main-part cross-sectional view that describes workings of the photoelectric conversion element illustrated in FIG. 1.

FIG. 9 is a schematic view for description of workings of the photoelectric conversion element illustrated in FIG. 1.

FIG. 10 is a functional block diagram of a solid-state imaging device using the photoelectric conversion element illustrated in FIG. 1 as a pixel.

FIG. 11 is a block diagram illustrating a schematic configuration of an electronic apparatus using the solid-state imaging device illustrated in FIG. 10.

FIG. 12 is a characteristic diagram illustrating a relationship between each wavelength in a visible light region and a linear absorption coefficient.

MODES FOR CARRYING OUT THE INVENTION

In the following, some embodiments of the present disclosure are described in detail with reference to drawings. It is to be noted that description is given in the following order.
1. Embodiment (An example in which an organic photoelectric conversion layer is formed using three kinds of materials)
   1-1. Configuration of Photoelectric Conversion Element
   1-2. Method of Manufacturing Photoelectric Conversion Element
   1-3. Workings and Effects
2. Application Examples
3. Examples 1. Embodiment FIG. 1 illustrates a cross-sectional configuration of a photoelectric conversion element (a photoelectric conversion element 10) according to an embodiment of the present disclosure. The photoelectric conversion element 10 configures, for example, one pixel (a unit pixel P) of a solid-state imaging device (a solid-state imaging device 1 in FIG. 10) such as a CCD image sensor and a CMOS image sensor. In the photoelectric conversion element 10, a pixel transistor (including transfer transistors Tr1 to Tr3 to be described later) is formed and a multilayer wiring layer (a multilayer wiring layer 51) is included on a front surface (a surface S2 opposite to a light reception surface (a surface S1)) of a semiconductor substrate 11.

The photoelectric conversion element 10 according to the present embodiment has a configuration in which one organic photoelectric converter 11G and two inorganic photoelectric converters 11B and 11R are stacked along a vertical direction. Each of the organic photoelectric converter 11G and the inorganic photoelectric converters 11B and 11R selectively detects light in a relevant one of wavelength regions different from one another, and perform photoelectric conversion on the thus-detected light. The organic photoelectric converter 11G includes three kinds of organic semiconductor materials.

(1-1. Configuration of Photoelectric Conversion Element)

The photoelectric conversion element 10 has a stacked configuration of one organic photoelectric converter 11G and two inorganic photoelectric converters 11B and 11R. The configuration allows one element to obtain color signals of red (R), green (G), and blue (B). The organic photoelectric converter 11G is formed on a back surface (the surface S1) of the semiconductor substrate 11, and the inorganic photoelectric converters 11B and 11R are so formed as to be embedded in the semiconductor substrate 11. Hereinafter, description is given of configurations of respective components.

(Organic Photoelectric Converter 11G)

The organic photoelectric converter 11G is an organic photoelectric conversion element that absorbs light in a selective wavelength region (green light herein) with use of an organic semiconductor to generate electron-hole pairs. The organic photoelectric converter 11G has a configuration in which an organic photoelectric conversion layer 17 is sandwiched between a pair of electrodes (a lower electrode 15a and an upper electrode 18) for extraction of signal electric charges. The lower electrode 15a and the upper electrode 18 are electrically coupled to conductive plugs 120a1 and 120b1 embedded in the semiconductor substrate 11 through wiring layers 13a, 13b, and 15b and a contact metal layer 20, as described later.

Specifically, in the organic photoelectric converter 11G, interlayer insulating films 12 and 14 are formed on the surface S1 of the semiconductor substrate 11, and the interlayer insulating film 12 is provided with through holes in regions facing the respective conductive plugs 120a1 and 120b1 to be described later. Each of the through holes is filled with a relevant one of conductive plugs 120a2 and 120b2. In the interlayer insulating film 14, wiring layers 13a and 13b are respectively embedded in regions facing the conductive plugs 120a2 and 120b2. The lower electrode 15a and the wiring layer 15b are provided on the interlayer insulating film 14. The wiring layer 15b is electrically isolated by the lower electrode 15a and an insulating film 16. The organic photoelectric conversion layer 17 is formed on the lower electrode 15a out of the lower electrode 15a and the wiring layer 15b, and the upper electrode 18 is so formed as to cover the organic photoelectric conversion layer 17. As described in detail later, a protective layer 19 is so formed on the upper electrode 18 as to cover a surface of the upper electrode 18. The protective layer 19 is provided with a contact hole H in a predetermined region, and the contact metal layer 20 is so formed on the protective layer 19 as to be contained in the contact hole H and to extend to a top surface of the wiring layer 15b.

The conductive plug 120a2 serves as a connector together with the conductive plug 120a1. Moreover, the conductive plug 120a2 forms, together with the conductive plug 120a1 and the wiring layer 13a, a transmission path of electric charges (electrons) from the lower electrode 15a to a green electric storage layer 110G to be described later. The conductive plug 120b2 serves as a connector together with the conductive plug 120b1. Moreover, the conductive plug 120b2 forms, together with the conductive plug 120b1, the wiring layer 13b, the wiring layer 15b, and the contact metal layer 20, a discharge path of electric charges (holes) from the upper electrode 18. In order to allow each of the conductive plugs 120a2 and 120b2 to also serve as a light-blocking film, each of the conductive plugs 120a2 and 120b2 is desirably configured of, for example, a laminated film of metal materials such as titanium (Ti), titanium nitride (TiN), and tungsten. Moreover, such a laminated film is desirably used, which makes it possible to secure contact with silicon even in a case where each of the conductive plugs 120a1 and 120b1 is formed as an n-type or p-type semiconductor layer.

The interlayer insulating film 12 is desirably configured of an insulating film having a small interface state in order to reduce an interface state with the semiconductor substrate 11 (a silicon layer 110) and to suppress generation of a dark current from an interface with the silicon layer 110. As such an insulating film, it is possible to use, for example, a laminated film configured of a hafnium oxide ($HfO_2$) film and a silicon oxide ($SiO_2$) film. The interlayer insulating film 14 is configured of a single-layer film including one of materials such as silicon oxide, silicon nitride, and silicon oxynitride (SiON), or is configured of a laminated film including two or more of these materials.

The insulating film 16 is configured of, for example, a single-layer film including one of materials such as silicon oxide, silicon nitride, and silicon oxynitride (SiON) or a laminated film including two or more of these materials. The insulating film 16 has, for example, a planarized surface, thereby having a shape and a pattern that each have almost no difference in level between the insulating film 16 and the lower electrode 15a. In a case where the photoelectric conversion element 10 is used as each of unit pixels P of the solid-state imaging device 1, the insulating film 16 has a function of electrically isolating the lower electrodes 15a of respective pixels from one another.

The lower electrode 15a is provided in a region that faces light reception surfaces of the inorganic photoelectric converters 11B and 11R formed in the semiconductor substrate 11 and covers these light reception surfaces. The lower electrode 15a is configured of a conductive film having light transparency, and includes, for example, ITO (indium tin oxide). Alternatively, as a constituent material of the lower electrode 15a, other than ITO, a tin oxide ($SnO_2$)-based material doped with a dopant or a zinc oxide-based material prepared by doping aluminum zinc oxide (ZnO) with a dopant may be used. Examples of the zinc oxide-based material include aluminum zinc oxide (AZO) doped with aluminum (Al) as a dopant, gallium zinc oxide (GZO) doped with gallium (Ga), and indium zinc oxide (IZO) doped with indium (In). Moreover, other than these materials, for example, CuI, $InSbO_4$, ZnMgO, $CuInO_2$, $MgIN_2O_4$, CdO, or $ZnSnO_3$ may be used. It is to be noted that in the present embodiment, signal electric charges (electrons) are extracted from the lower electrode 15a; therefore, in the solid-state imaging device 1 to be described later that uses the photoelectric conversion element 10 as each of the unit pixels P, the lower electrode 15a is formed separately for each of the pixels.

The organic photoelectric conversion layer 17 includes three kinds of organic semiconductor materials, i.e., a first organic semiconductor material, a second organic semiconductor material, and a third organic semiconductor material. The organic photoelectric conversion layer 17 preferably includes one or both of a p-type semiconductor and an n-type semiconductor, and one of the three kinds of organic semiconductor materials mentioned above is the p-type semiconductor or the n-type semiconductor. The organic photoelectric conversion layer 17 performs photoelectric conversion on light in a selective wavelength region, and allows light in other wavelength regions to pass therethrough. In the present embodiment, the organic photoelectric conversion layer 17 has, for example, a maximal absorption wavelength in a range from 450 nm to 650 nm both inclusive.

As the first organic semiconductor material, a material having a high electron transporting property is preferable, and examples of such a material include C60 fullerene and a derivative thereof represented by the following formula (1), and C70 fullerene and a derivative thereof represented by the following formula (2). It is to be noted that in the present embodiment, fullerenes are treated as organic semiconductor materials.

[Chem. 1]

(1)

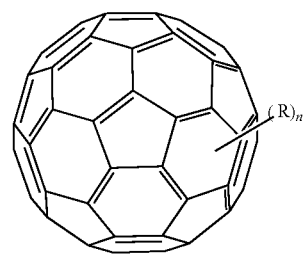

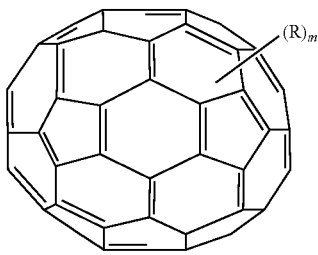

(2)

where each R is independently one of a hydrogen atom, a halogen atom, a straight-chain, branched, or cyclic alkyl group, a phenyl group, a group having a straight-chain or condensed ring aromatic compound, a group having a halide, a partial fluoroalkyl group, a perfluoroalkyl group, a silylalkyl group, a silyl alkoxy group, an arylsilyl group, an arylsulfanyl group, an alkylsulfanyl group, an arylsulfonyl group, an alkylsulfonyl group, an arylsulfide group, an alkylsulfide group, an amino group, an alkylamino group, an arylamino group, a hydroxy group, an alkoxy group, an acylamino group, an acyloxy group, a carbonyl group, a carboxy group, a carboxyamide group, a carboalkoxy group, an acyl group, a sulfonyl group, a cyano group, a nitro group, a group having a chalcogenide, a phosphine group, a phosphone group, and derivatives thereof, and each of "n" and "m" is 0 or an integer of 1 or more.

Specific examples of the first organic semiconductor material include not only C60 fullerene represented by a formula (1-1) and C70 fullerene represented by a formula (2-1) but also compounds represented by the following formulas (1-2), (1-3), and (2-2) as derivatives of C60 fullerene and C70 fullerene.

[Chem. 2]

(1-1)

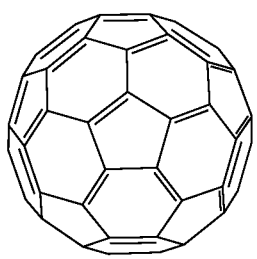

$C_{60}$ (1-2)

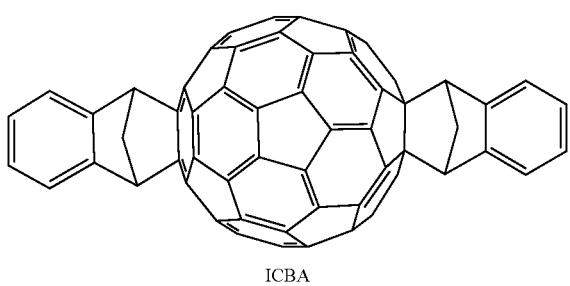

ICBA (1-3)

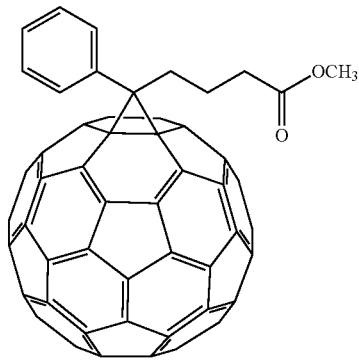

[60]PCBM (2-1)

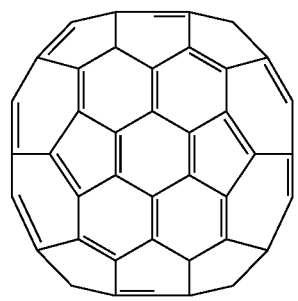

$C_{70}$ (2-2)

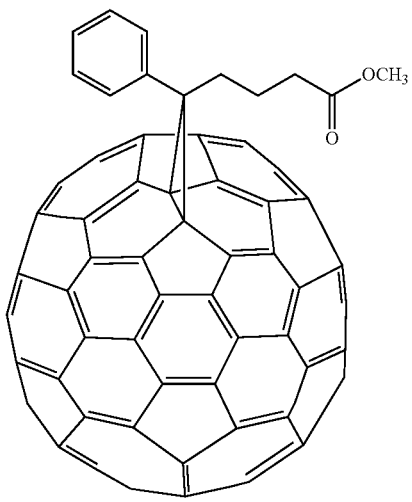

[70]PCBM

Table 1 provides a summary of electron mobility of C60 fullerene (the formula (1-1)), C70 fullerene (the formula (2-1)), and the fullerene derivatives represented by the foregoing formulas (1-2), (1-3), and (2-2). Using an organic semiconductor material having high electron mobility, preferably $10^{-7}$ cm2/Vs or more, more preferably $10^{-4}$ cm2/Vs or more improves electron mobility resulting from separation of excitons into electric charges, and improves responsivity of the organic photoelectric converter 11G.

TABLE 1

| | Electron Mobility (cm²/Vs) |
|---|---|
| C60 Fullerene | $2 \times 10^{-2}$ |
| C70 Fullerene | $3 \times 10^{-3}$ |
| [60]PCBM | $5 \times 10^{-2}$ |
| [70]PCBM | $3 \times 10^{-4}$ |
| ICBA | $2 \times 10^{-3}$ |

As the second organic semiconductor material, a material in a form of a single-layer film having a higher linear absorption coefficient of a maximal absorption wavelength in a visible light region than a single-layer film of the first organic semiconductor material and a single-layer film of the third organic semiconductor material to be described later is preferable. This makes it possible to enhance absorption capacity of light in the visible light region of the organic photoelectric conversion layer 17 and to sharpen a spectroscopic shape. It is to be noted that the visible light region here is in a range from 450 nm to 800 nm both inclusive. The single-layer film here is referred to as a single-layer film including one kind of organic semiconductor material. This similarly applies to the following single-layer film in each of the second organic semiconductor material and the third organic semiconductor material.

As the third organic semiconductor material, a material having a value equal to or higher than a HOMO level of the second organic semiconductor material and having a high hole transporting property is preferable. Specifically, a material in a form of a single-layer film having higher hole mobility than hole mobility of the single-layer film of the second organic semiconductor material is preferable.

Specific examples of the second organic semiconductor material include subphthalocyanine and a derivative thereof represented by a formula (6). Specific examples of the third organic semiconductor material include quinacridone and a derivative thereof represented by the following formula (3), triallylamine and a derivative thereof represented by the following formula (4), and benzothienobenzothiophene and a derivative thereof represented by a formula (5).

[Chem. 3]

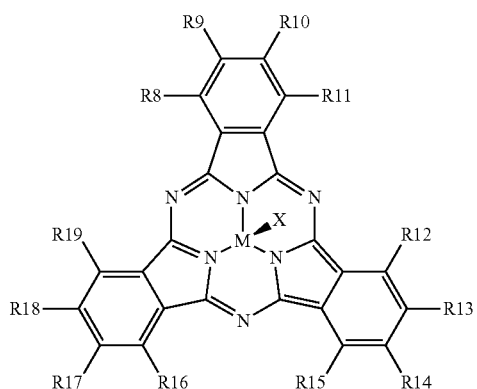

(6)

where each of R8 to R19 is independently selected from a group configured of a hydrogen atom, a halogen atom, a straight-chain, branched, or cyclic alkyl group, a thioalkyl group, a thioaryl group, an arylsulfonyl group, an alkylsulfonyl group, an amino group, an alkylamino group, an arylamino group, a hydroxy group, an alkoxy group, an acylamino group, an acyloxy group, a phenyl group, a carboxy group, a carboxyamide group, a carboalkoxy group, an acyl group, a sulfonyl group, a cyano group, and a nitro group, any adjacent ones of R8 to R19 are optionally part of a condensed aliphatic ring or a condensed aromatic ring, the condensed aliphatic ring or the condensed aromatic ring optionally includes one or more atoms other than carbon, M is one of boron and a divalent or trivalent metal, and X is an anionic group.

[Chem. 4]

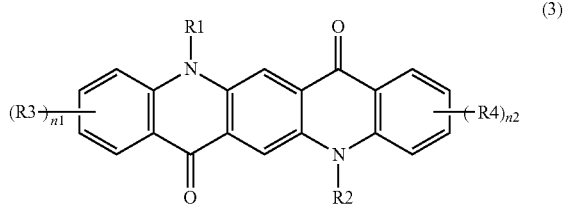

(3)

where each of R1 and R2 is independently one of a hydrogen atom, an alkyl group, an aryl group, and a heterocyclic group, each of R3 and R4 is any group and is not specifically limited, but, for example, each of R3 and R4 is independently one of an alkyl chain, an alkenyl group, an alkynyl group, an aryl group, a cyano group, a nitro group, and a silyl group, and two or more of R3 or two or more of R4 optionally form a ring together, and each of n1 and n2 is independently 0 or an integer of 1 or more.

[Chem. 5]

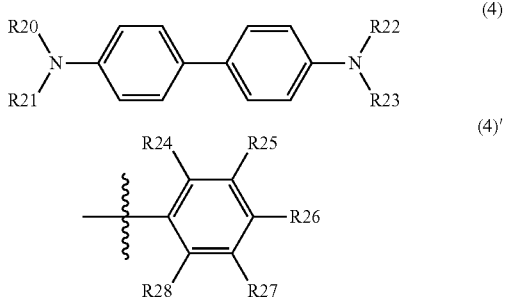

(4)

(4)' where each of R20 to R23 is independently a substituent represented by a formula (4)', each of R24 to R28 is independently one of a hydrogen atom, a halogen atom, an aryl group, an aromatic hydrocarbon ring group, an aromatic hydrocarbon ring group having an alkyl chain or a substituent, an aromatic heterocyclic group, and an aromatic heterocyclic group having an alkyl chain or a substituent, adjacent ones of R24 to R28 are optionally saturated or unsaturated divalent groups that are bound to one another to form a ring.

[Chem. 6]

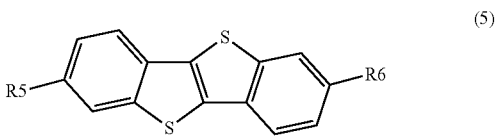

(5)

-continued (5)'

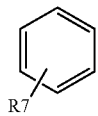

where each of R5 and R6 is independently one of a hydrogen atom and a substituent represented by a formula (5)', and R7 is one of an aromatic ring group and an aromatic ring group having a substituent.

Specific examples of the subphthalocyanine derivative represented by the formula (6) include compounds represented by the following formulas (6-1) to (6-5).

[Chem. 7]

(6-1)

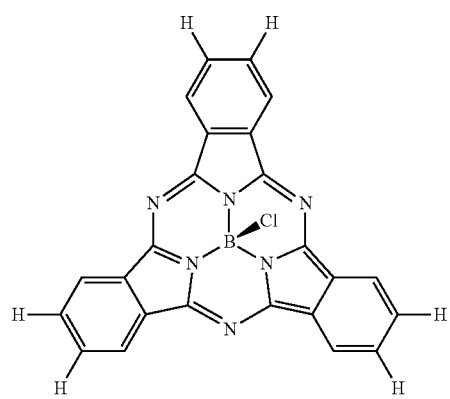

SubPcCl (6-2)

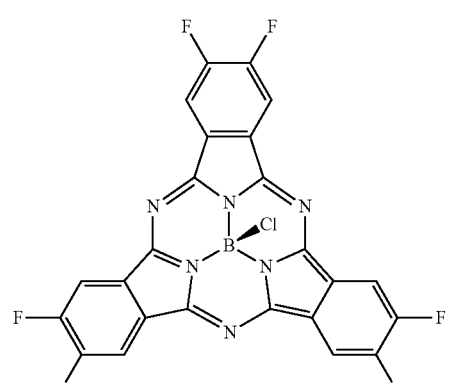

F$_6$SubPcCl (6-3)

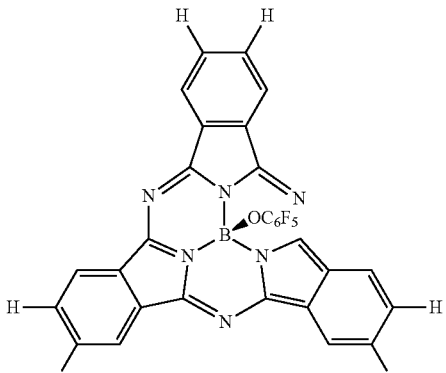

SubPcOC$_6$F$_5$ (6-4)

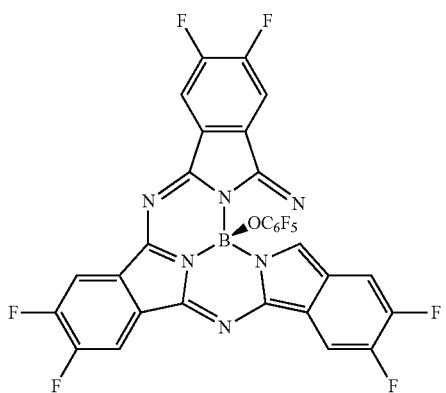

F$_6$SubPcOC$_6$F$_5$ (6-5)

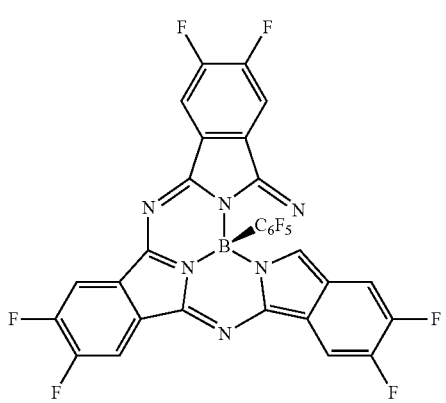

F$_6$SubPcC$_6$F$_5$

Specific examples of the quinacridone derivative represented by the formula (3) include compounds represented by the following formulas (3-1) to (3-3).

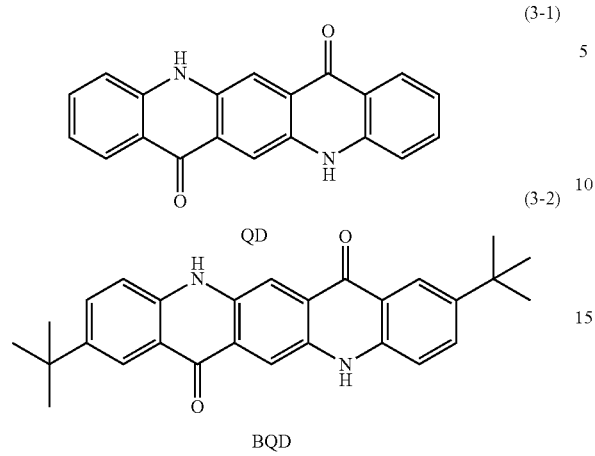
QD
BQD
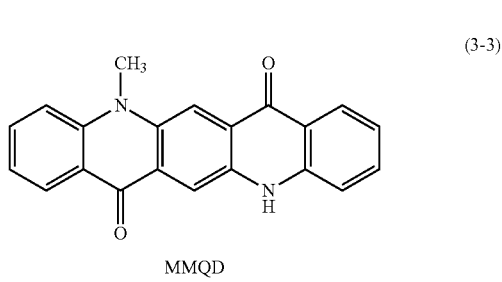
MMQD
Specific examples of the triallylamine derivative represented by the formula (4) include compounds represented by the following formulas (4-1) to (4-13).
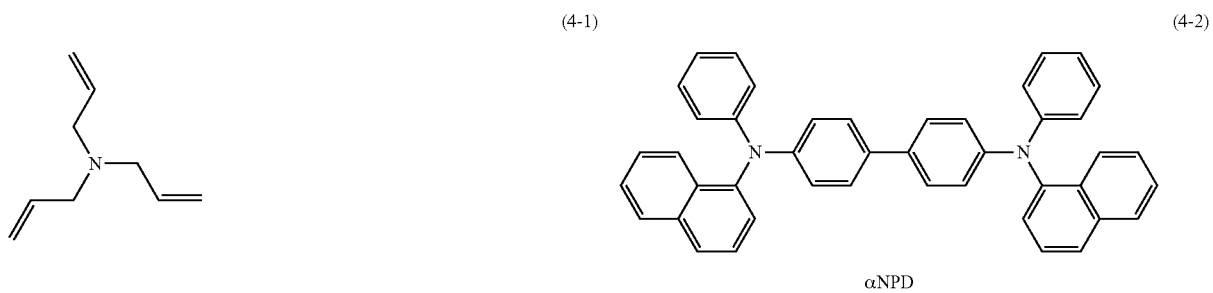
(4-1)
(4-2) αNPD
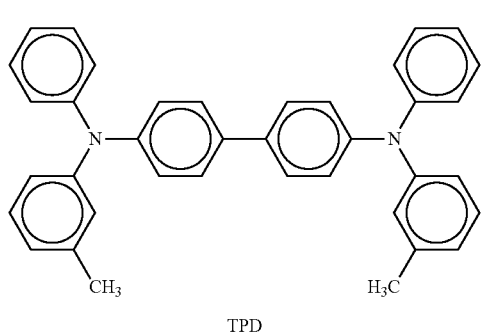
TPD
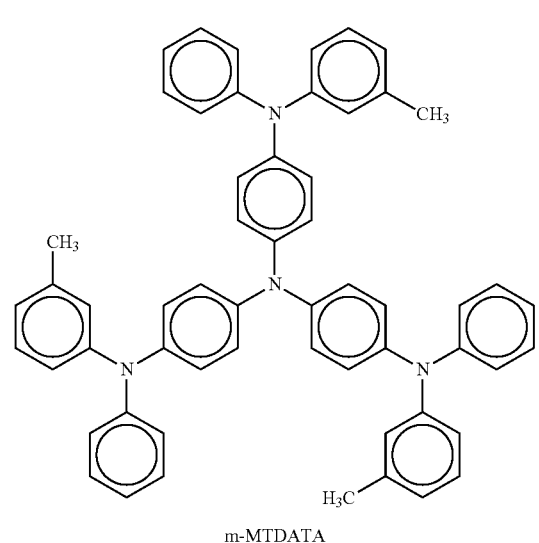
m-MTDATA -continued
(4-5)
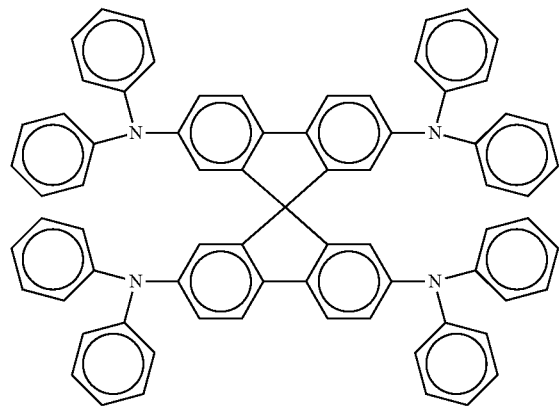
spiro-TPD
(4-6)
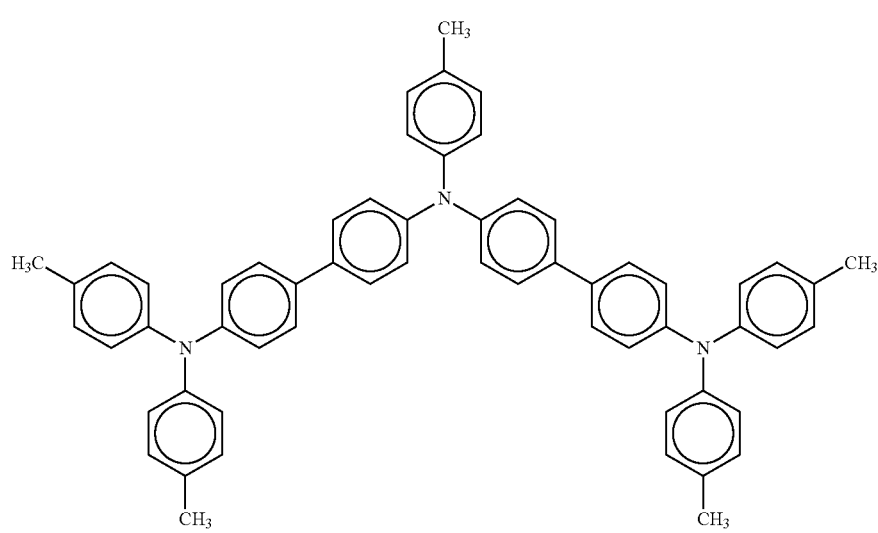
m-MTDATA
(4-7)
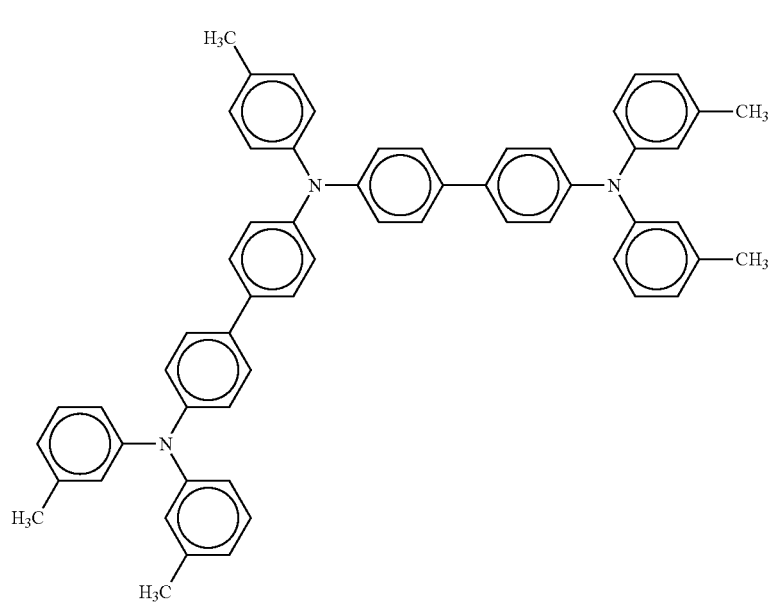
TPTR -continued
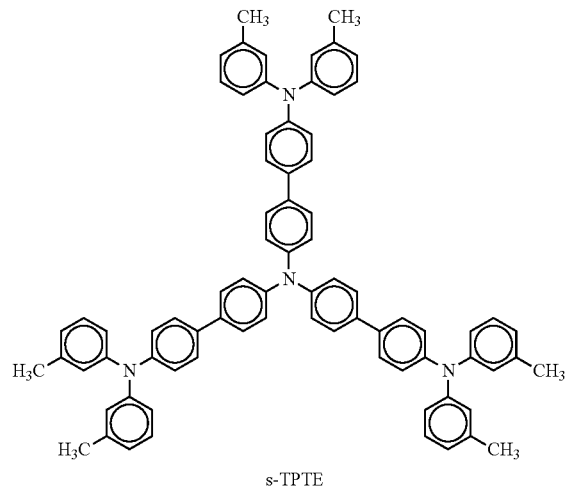
s-TPTE (4-8)
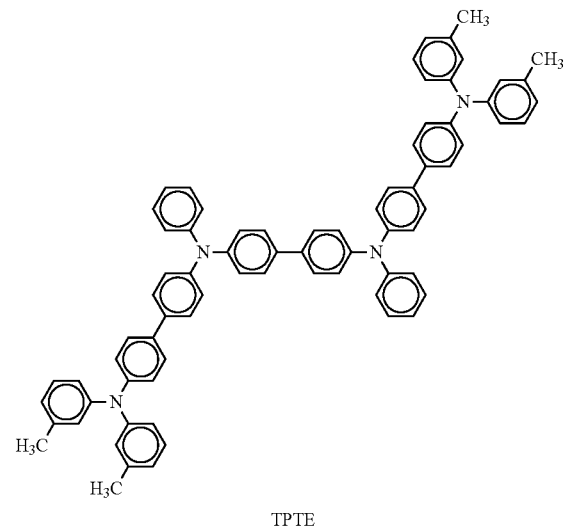
TPTE (4-9)
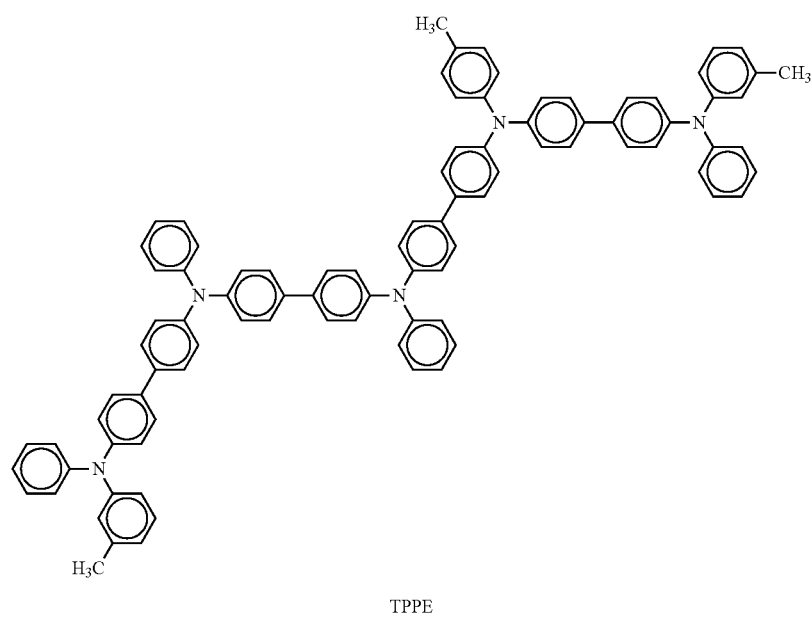
TPPE (4-10)
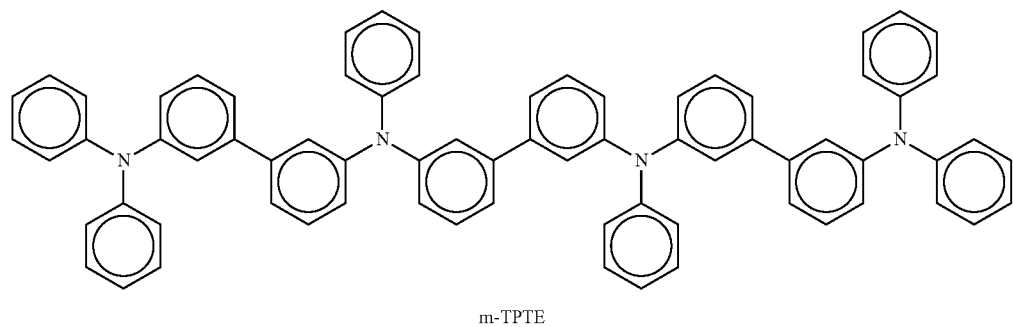
m-TPTE (4-11)

(4-12)
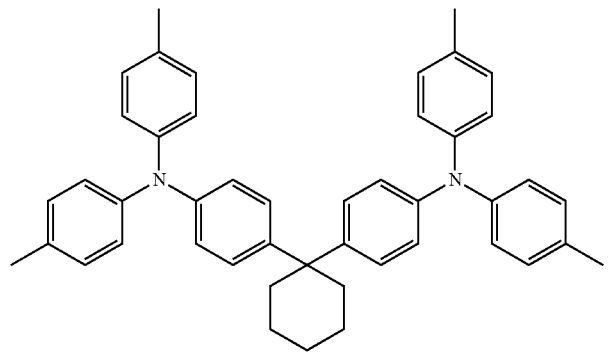
TAPC
(4-13)
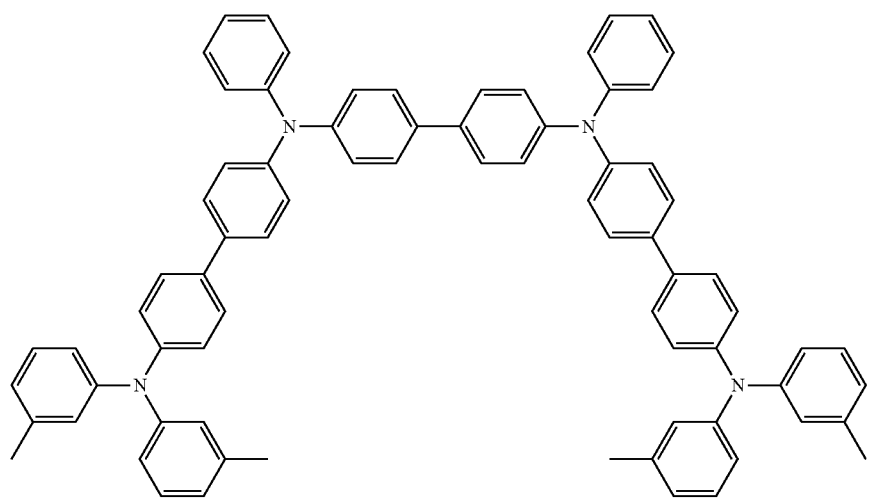
TPT9
Specific examples of the benzothienobenzothiophene derivative represented by the formula (5) include compounds represented by the following formulas (5-1) to (5-8).
[Chem. 10]
(5-1)
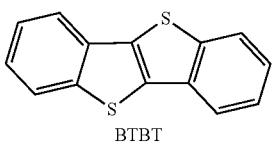
BTBT
(5-2)
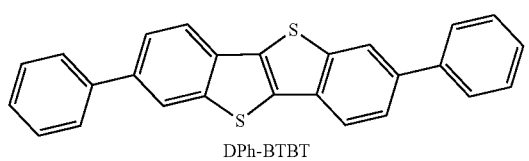
DPh-BTBT
(5-3)
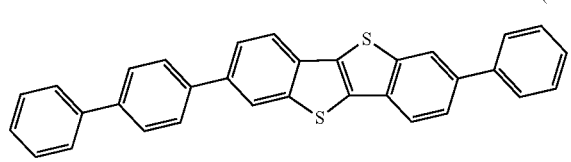
(5-4)
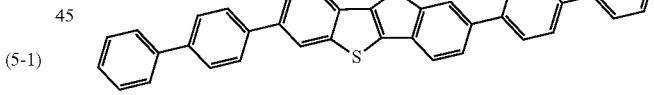
(5-6)
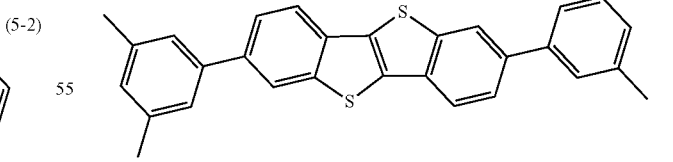
(5-7)
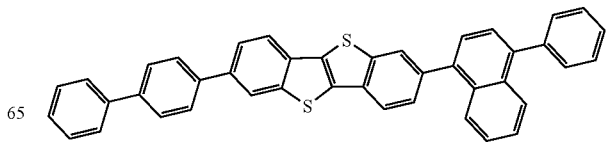

-continued (5-8)

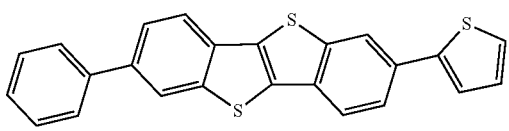

Examples of the third organic semiconductor material include rubrene represented by the following formula (8) and N,N'-di(1-naphthyl-N,N'-diphenylbenzidine (αNPD) and a derivative thereof represented by the foregoing formula (4-2), in addition to quinacridone and the derivative thereof, triallylamine and the derivative thereof, and benzothienobenzothiophene and the derivative thereof mentioned above. Note that the third organic semiconductor material more preferably includes a hetero element other than carbon (C) and hydrogen (H) in a molecule of the third organic semiconductor material. Examples of the hetero element include nitrogen (N), phosphorus (P), and chalcogen elements such as oxygen (O), sulfur (S), and selenium (Se).

[Chem. 11]

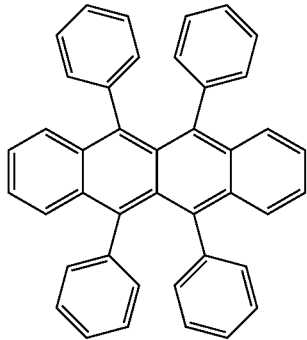

(8)

Table 2 and Table 3 provide summaries of HOMO levels (Table 2) and hole mobility (Table 3) of $SubPcOC_6F_5$ represented by the formula (6-3) and $F_6SubPcCl$ represented by the formula (6-2) as examples of a material applicable as the second organic semiconductor material, quinacridone (QD) represented by the formula (3-1), butylquinacridone (BQD) represented by the formula (3-2), αNPD represented by the formula (4-2), [1]Benzothieno[3,2-b][1]benzothiophene (BTBT) represented by the formula (5-1), and rubrene represented by the formula (8) as examples of a material applicable as the third organic semiconductor material, and Du-H represented by a formula (7) to be described later as a reference. It is to be noted that the HOMO level and the hole mobility provided in Tables 2 and 3 are calculated with use of a method to be described in experiments 2-1 and 2-2 of examples to be described later. The third organic semiconductor material preferably has a HOMO level equal to or higher than the HOMO level of the second organic semiconductor material. Moreover, the single-layer film of the third organic semiconductor material preferably has higher hole mobility than hole mobility of the single-layer film of the second organic semiconductor material. The HOMO level of the third organic semiconductor material is preferably, for example, $10^{-7}$ cm$^2$/Vs or more, and more preferably $10^{-4}$ cm$^2$/Vs or more. Using such organic semiconductor materials improves hole mobility resulting from separation of excitons into electric charges. This achieves balance with a high electron transporting property supported by the first organic semiconductor material, thereby improving responsivity of the organic photoelectric converter 11G. It is to be noted that -5.5 eV that is the HOMO level of QD is higher than -6.3 eV that is the HOMO level of $F_6SubPcOCl$.

TABLE 2

| | HOMO (eV) |
|---|---|
| QD | -5.5 |
| αNPD | -5.5 |
| BTBT | -5.6 |
| $SubPcOC_6F_5$ | -5.9 |
| Du—H | -6.1 |
| $F_6SubPcCl$ | -6.3 |
| BQD | -5.6 |
| rubrene | -5.5 |

TABLE 3

| | Hole Mobility (cm$^2$/Vs) |
|---|---|
| QD | $2 \times 10^{-5}$ |
| αNPD | $>10^{-4}$ |
| BTBT | $>10^{-3}$ |
| $SubPcOC_6F_5$ | $1 \times 10^{-8}$ |
| Du—H | $1 \times 10^{-10}$ |
| $F_6SubPcCl$ | $<10^{-10}$ |
| BQD | $1 \times 10^{-6}$ |
| rubrene | $3 \times 10^{-6}$ |

It is to be noted that in a case where the triallylamine derivative is used as the third organic semiconductor material, the triallylamine derivative is not limited to the compounds represented by the foregoing formulas (4-1) to (4-13), and may be any triallylamine derivative having a HOMO level equal to or higher than the HOMO level of the second organic semiconductor material. Moreover, the triallylamine derivative may be any triallylamine derivative that has higher hole mobility in a form of a single-layer film than hole mobility of the single-layer film of the second organic semiconductor material.

As described above, as a specific combination of the second organic semiconductor material and the third organic semiconductor material, for example, in a case where the subphthalocyanine derivative is used as the second organic semiconductor material, one of the quinacridone derivative, the triallylamine derivative, the benzothienobenzothiophene derivative, and rubrene is selected as the third organic semiconductor material.

Contents of the first organic semiconductor material, the second organic semiconductor material, and the third organic semiconductor material configuring the organic photoelectric conversion layer 17 are preferably in the following ranges. The content of the first organic semiconductor material is preferably, for example, in a range from 10 vol % to 35 vol % both inclusive, the content of the second organic semiconductor material is preferably, for example, in a range from 30 vol % to 80 vol % both inclusive, and the content of the third organic semiconductor material is preferably, for example, in a range from 10 vol % to 60 vol % both inclusive. Moreover, it is desirable to include substantially equal amounts of the first organic semiconductor material, the second organic semiconductor material, and the third organic semiconductor material. In a case where the amount of the first organic semiconductor material is too small, electron transporting performance of the organic photoelectric conversion layer 17 declines, which causes a deterioration in responsivity. In a case where the amount of the first organic semiconductor material is too large, the spectroscopic shape may be deteriorated. In a case where the amount of the second organic semiconductor material is too small, light absorption capacity in the visible light region and the spectroscopic shape may be deteriorated. In a case where the amount of the second organic semiconductor material is too large, electron transporting performance and hole transporting performance decline. In a case where the amount of the third organic semiconductor material is too small, hole transporting property declines, which causes a deterioration in responsivity. In a case where the amount of the third organic semiconductor material is too large, light absorption capacity in the visible light region and the spectroscopic shape may be deteriorated.

Any other unillustrated layer may be provided between the organic photoelectric conversion layer 17 and the lower electrodes 15a and between the organic photoelectric conversion layer 17 and the upper electrode 18. For example, an undercoat film, a hole transport layer, an electron blocking film, the organic photoelectric conversion layer 17, a hole blocking film, a buffer film, an electron transport layer, and a work function adjustment film may be stacked in order from the lower electrode 15a.

The upper electrode 18 is configured of a conductive film having light transparency as with the lower electrode 15a. In the solid-state imaging device using the photoelectric conversion element 10 as each of the pixels, the upper electrode 18 may be separately provided for each of the pixels, or may be formed as a common electrode for the respective pixels. The upper electrode 18 has, for example, a thickness of 10 nm to 200 nm both inclusive.

The protective layer 19 includes a material having light transparency, and is, for example, a single-layer film including one of materials such as silicon oxide, silicon nitride, and silicon oxynitride or a laminated film including two or more of these materials. The protective layer 19 has, for example, a thickness of 100 nm to 30000 nm both inclusive.

The contact metal layer 20 includes, for example, one of materials such as titanium (Ti), tungsten (W), titanium nitride (TiN), and aluminum (Al), or is configured of a laminated film including two or more of these materials.

The upper electrode 18 and the protective layer 19 are so provided as to cover the organic photoelectric conversion layer 17, for example. FIG. 2 illustrates planar configurations of the organic photoelectric conversion layer 17, the protective layer 19 (the upper electrode 18), and the contact hole H.

Specifically, an edge e2 of the protective layer 19 (and the upper electrode 18) is located outside of an edge e1 of the organic photoelectric conversion layer 17, and the protective layer 19 and the upper electrode 18 are so formed as to protrude toward outside of the organic photoelectric conversion layer 17. More specifically, the upper electrode 18 is so formed as to cover a top surface and a side surface of the organic photoelectric conversion layer 17, and as to extend onto the insulating film 16. The protective layer 19 is so formed as to cover a top surface of such an upper electrode 18, and is formed in a similar planar shape to that of the upper electrode 18. The contact hole H is provided in a region not facing the organic photoelectric conversion layer 17 (a region outside of the edge e1) of the protective layer 19, and allows a portion of a surface of the upper electrode 18 to be exposed from the contact hole H. A distance between the edges e1 and e2 is not particularly limited, but is, for example, in a range from 1 μm to 500 μm both inclusive. It is to be noted that in FIG. 2, one rectangular contact hole H along an end side of the organic photoelectric conversion layer 17 is provided; however, a shape of the contact hole H and the number of the contact holes H are not limited thereto, and the contact hole H may have any other shape (for example, a circular shape or a square shape), and a plurality of contact holes H may be provided.

The planarization layer 21 is so formed on the protective layer 19 and the contact metal layer 20 as to cover entire surfaces of the protective layer 19 and the contact metal layer 20. An on-chip lens 22 (a microlens) is provided on the planarization layer 21. The on-chip lens 22 concentrates light incoming from a top of the on-chip lens 22 onto each of light reception surfaces of the organic photoelectric converter 11G and the inorganic photoelectric converters 11B and 11R. In the present embodiment, the multilayer wiring layer 51 is formed on the surface S2 of the semiconductor substrate 11, which makes it possible to dispose the respective light reception surfaces of the organic photoelectric converter 11G and the inorganic photoelectric converters 11B and 11R close to one another. This makes it possible to reduce variation in sensitivity between respective colors caused depending on an F value of the on-chip lens 22.

It is to be noted that in the photoelectric conversion element 10 according to the present embodiment, signal electric charges (electrons) are extracted from the lower electrode 15a; therefore, in the solid-state imaging device using the photoelectric conversion element 10 as each of the pixels, the upper electrode 18 may be a common electrode. In this case, a transmission path configured of the contact hole H, the contact metal layer 20, the wiring layers 15b and 13b, the conductive plugs 120b1 and 120b2 mentioned above may be formed at least at one position for all pixels.

In the semiconductor substrate 11, for example, the inorganic photoelectric converters 11B and 11R and the green electric storage layer 110G are so formed as to be embedded in a predetermined region of the n-type silicon (Si) layer 110. Moreover, the conductive plugs 120a1 and 120b1 configuring a transmission path of electric charges (electrons or holes) from the organic photoelectric converter 11G are embedded in the semiconductor substrate 11. In the present embodiment, a back surface (the surface S1) of the semiconductor substrate 11 serves as a light reception surface. A plurality of pixel transistors (including transfer transistors Tr1 to Tr3) corresponding to the organic photoelectric converter 11G and the inorganic photoelectric converters 11B and 11R are formed on the surface (the surface S2) side of the semiconductor substrate 11, and a peripheral circuit including a logic circuit, etc. is formed on the surface (the surface S2) side of the semiconductor substrate 11.

Examples of the pixel transistor include a transfer transistor, a reset transistor, an amplification transistor, and a selection transistor. Each of these pixel transistors is configured of, for example, a MOS transistor, and is formed in a p-type semiconductor well region on the surface S2 side. A circuit including such pixel transistors is formed for each of photoelectric converters of red, green, and blue. Each of the circuits may have, for example, a three-transistor configuration including three transistors in total, i.e., the transfer transistor, the reset transistor, and the amplification transistor out of these pixel transistors, or may have, for example, a four-transistor configuration further including the selection transistor in addition to the three transistors mentioned above. Only the transfer transistors Tr1 to Tr3 of these pixel transistors are illustrated and described hereinbelow. Moreover, it is possible to share the pixel transistors other than the transfer transistor among the photoelectric converters or among the pixels. Further, a so-called pixel sharing configuration in which a floating diffusion is shared is applicable.

The transfer transistors Tr1 to Tr3 include gate electrodes (gate electrodes TG1 to TG3) and floating diffusions (FD 113, 114, and 116). The transfer transistor Tr1 transfers, to a vertical signal line Lsig to be described later, signal electric charges (electrons in the present embodiment) corresponding to green that are generated in the organic photoelectric converter 11G and stored in the green electric storage layer 110G. The transfer transistor Tr2 transfers, to the vertical signal line Lsig to be described later, signal electric charges (electrons in the present embodiment) corresponding to blue that are generated and stored in the inorganic photoelectric converter 11B. Likewise, the transfer transistor Tr3 transfers, to the vertical signal line Lsig to be described later, signal electric charges (electrons in the present embodiment) corresponding to red that are generated and stored in the inorganic photoelectric converter 11R.

The inorganic photoelectric converters 11B and 11R are each a photodiode having a p-n junction, and are formed in an optical path in the semiconductor substrate 11 in this order from the surface S1. The inorganic photoelectric converter 11B of the inorganic photoelectric converters 11B and 11R selectively detects blue light and stores signal electric charges corresponding to blue, and is so formed as to extend, for example, from a selective region along the surface S1 of the semiconductor substrate 11 to a region in proximity to an interface with the multilayer wiring layer 51. The inorganic photoelectric converter 11R selectively detects red light and stores signal electric charges corresponding to red, and is formed, for example, in a region below the inorganic photoelectric converter 11B (closer to the surface S2). It is to be noted that blue (B) and red (R) are, for example, a color corresponding to a wavelength region from 450 nm to 495 nm both inclusive and a color corresponding to a wavelength region from 620 nm to 750 nm both inclusive, respectively, and each of the inorganic photoelectric converters 11B and 11R may be allowed to detect light of part or the entirety of the relevant wavelength region.

FIG. 3A illustrates specific configuration examples of the inorganic photoelectric converters 11B and 11R. FIG. 3B corresponds to a configuration in other cross-section of FIG. 3A. It is to be noted that in the present embodiment, description is given of a case where electrons of electron-hole pairs generated by photoelectric conversion are read as signal electric charges (in a case where an n-type semiconductor region serves as a photoelectric conversion layer). Moreover, in the drawings, a superscript "+(plus)" placed at "p" or "n" indicates that p-type or n-type impurity concentration is high. Further, gate electrodes TG2 and TG3 of the transfer transistors Tr2 and Tr3 out of the pixel transistors are also illustrated.

The inorganic photoelectric converter 11B includes, for example, a p-type semiconductor region (hereinafter simply referred to as p-type region, an n-type semiconductor region is referred in a similar manner) 111$p$ serving as a hole storage layer and an n-type photoelectric conversion layer (an n-type region) 111$n$ serving as an electron storage layer. The p-type region 111$p$ and the n-type photoelectric conversion layer 111$n$ are formed in respective selective regions in proximity to the surface S1, and are bent and extend to allow a portion thereof to reach an interface with the surface S2. The p-type region 111$p$ is coupled to an unillustrated p-type semiconductor well region on the surface S1 side. The n-type photoelectric conversion layer 111$n$ is coupled to the FD 113 (an n-type region) of the transfer transistor Tr2 for blue. It is to be noted that a p-type region 113$p$ (a hole storage layer) is formed in proximity to an interface between each of ends on the surface S2 side of the p-type region 111$p$ and the n-type photoelectric conversion layer 111$n$ and the surface S2.

The inorganic photoelectric converter 11R is configured of, for example, p-type regions 112$p$1 and 112$p$2 (hole storage layers), and an n-type photoelectric conversion layer 112$n$ (an electron storage layer) sandwiched between the p-type regions 112$p$1 and 112$p$2 (that is, has a p-n-p laminated structure). The n-type photoelectric conversion layer 112$n$ is bent and extends to allow a portion thereof to reach an interface with the surface S2. The n-type photoelectric conversion layer 112$n$ is coupled to the FD 114 (an n-type region) of the transfer transistor Tr3 for red. It is to be noted that a p-type region 113$p$ (a hole storage layer) is formed at least in proximity to an interface between the end on the surface S2 side of the n-type photoelectric conversion layer 111$n$ and the surface S2.

FIG. 4 illustrates a specific configuration example of the green electric storage layer 110G. It is to be noted that hereinafter, description is given of a case where electrons of electrons-hole pairs generated by the organic photoelectric converter 11G are read as signal electric charges from the lower electrode 15$a$. Moreover, the gate electrode TG1 of the transfer transistor Tr1 out of the pixel transistors is also illustrated in FIG. 4.

The green electric storage layer 110G includes an n-type region 115$n$ serving as an electron storage layer. A portion of the n-type region 115$n$ is coupled to the conductive plug 120$a$1, and stores electrons transmitted from the lower electrode 15$a$ through the conductive plug 120$a$1. The n-type region 115$n$ is also coupled to the FD 116 (an n-type region) of the transfer transistor Tr1 for green. It is to be noted that a p-type region 115$p$ (a hole storage layer) is formed in proximity to an interface between the n-type region 115$n$ and the surface S2.

The conductive plugs 120$a$1 and 120$b$2 function as connectors between the organic photoelectric converter 11G and the semiconductor substrate 11 together with the conductive plugs 120$a$2 and 120$a$2 to be described later, and configure a transmission path of electrons or holes generated in the organic photoelectric converter 11G. In the present embodiment, the conductive plug 120$a$1 is brought into conduction with the lower electrode 15$a$ of the organic photoelectric converter 11G, and is coupled to the green electric storage layer 110G. The conductive plug 120$b$1 is brought into conduction with the upper electrode 18 of the organic photoelectric converter 11G, and serves as a wiring line for discharge of holes.

Each of the conductive plugs 120$a$1 and 120$b$1 is configured of, for example, a conductive semiconductor layer, and is so formed as to be embedded in the semiconductor substrate 11. In this case, the conductive plug 120$a$1 is of an n type (to serve as an electron transmission path), and the conductive plug 120$b$1 is of a p type (to serve as a hole transmission path). Alternatively, each of the conductive plugs 120$a$1 and 120$b$1 is configured of, for example, a conductive film material such as tungsten (W) contained in a through via. In this case, for example, to suppress a short circuit with silicon (Si), it is desirable to cover a via side surface with an insulating film including, for example, silicon oxide ($SiO_2$) or silicon nitride (SiN).

The multilayer wiring layer 51 is formed on the surface S2 of the semiconductor substrate 11. In the multilayer wiring layer 51, a plurality of wiring lines 51$a$ are provided with an interlayer insulating film 52 in between. As described above, in the photoelectric conversion element 10, the multilayer wiring layer 51 is formed on side opposite to the light reception surface, which makes it possible to achieve a so-called back-side illumination type solid-state imaging device. For example, a supporting substrate 53 including silicon (Si) is bonded to the multilayer wiring layer 51.

(1-2. Method of Manufacturing Photoelectric Conversion Element)

It is possible to manufacture the photoelectric conversion element 10 as follows, for example. FIGS. 5A to 7C illustrate a method of manufacturing the photoelectric conversion element 10 in process order. It is to be noted that FIGS. 7A to 7C illustrate only a main-part configuration of the photoelectric conversion element 10.

First, the semiconductor substrate 11 is formed. Specifically, a so-called SOI substrate is prepared. In the SOI substrate, the silicon layer 110 is formed on a silicon base 1101 with a silicon oxide film 1102 in between. It is to be noted that a surface on side on which the silicon oxide film 1102 is located, of the silicon layer 110 serves as the back surface (the surface S1) of the semiconductor substrate 11. FIGS. 5A and 5B illustrate a state in which a configuration illustrated in FIG. 1 is vertically inverted. Next, the conductive plugs 120a1 and 120b1 are formed in the silicon layer 110, as illustrated in FIG. 5A. At this occasion, through vias are formed in the silicon layer 110, and thereafter, a barrier metal such as silicon nitride described above and tungsten are contained in the through vias, which makes it possible to form the conductive plugs 120a1 and 120b1. Alternatively, a conductive extrinsic semiconductor layer may be formed by, for example, ion implantation on the silicon layer 110. In this case, the conductive plug 120a1 is formed as an n-type semiconductor layer, and the conductive plug 120b1 is formed as a p-type semiconductor layer. Thereafter, the inorganic photoelectric converters 11B and 11R each having, for example, the p-type region and the n-type region as illustrated in FIG. 3A are formed by ion implantation in regions located at depths different from each other in the silicon layer 110 (to be superimposed on each other). Moreover, the green electric storage layer 110G is formed by ion implantation in a region adjacent to the conductive plug 120a1. Thus, the semiconductor substrate 11 is formed.

Subsequently, the pixel transistors including the transfer transistors Tr1 to Tr3 and peripheral circuits such as a logic circuit are formed on the surface S2 side of the semiconductor substrate 11, and thereafter, a plurality of layers of wiring lines 51a are formed on the surface S2 of the semiconductor substrate 11 with the interlayer insulating film 52 in between to form the multilayer wiring layer 51, as illustrated in FIG. 5B. Next, the supporting substrate 53 including silicon is bonded onto the multilayer wiring layer 51, and thereafter, the silicon base 1101 and the silicon oxide film 1102 are removed from the surface S1 of the semiconductor substrate 11 to expose the surface S1 of the semiconductor substrate 11.

Next, the organic photoelectric converter 11G is formed on the surface S1 of the semiconductor substrate 11. Specifically, first, the interlayer insulating film 12 configured of the foregoing laminated film including the hafnium oxide film and the silicon oxide film is formed on the surface S1 of the semiconductor substrate 11, as illustrated in FIG. 6A. For example, after the hafnium oxide film is formed by an ALD (atomic layer deposition) method, the silicon oxide film is formed by, for example, a plasma CVD (Chemical Vapor Deposition) method. Thereafter, the contact holes H1a and H1b are formed at positions facing the conductive plugs 120a1 and 120b1 of the interlayer insulating film 12, and the conductive plugs 120a2 and 120b2 including the foregoing material are formed so as to be contained in the contact holes H1a and H1b, respectively. At this occasion, the conductive plugs 120a2 and 120b2 may be formed to protrude to a region to be light-blocked (to cover the region to be light-blocked). Alternatively, a light-blocking layer may be formed in a region isolated from the conductive plugs 120a2 and 120b2.

Subsequently, the interlayer insulating film 14 including the foregoing material is formed by, for example, a plasma CVD method, as illustrated in FIG. 6B. It is to be noted that after film formation, a front surface of the interlayer insulating film 14 is desirably planarized by, for example, a CMP (Chemical Mechanical Polishing) method. Next, contact holes are formed at positions facing the conductive plugs 120a2 and 120b2 of the interlayer insulating film 14, and the contact holes are filled with the foregoing material to form the wiring layers 13a and 13b. It is to be noted that, thereafter, a surplus wiring layer material (such as tungsten) on the interlayer insulating film 14 is desirably removed by a CMP method or any other method. Next, the lower electrode 15a is formed on the interlayer insulating film 14. Specifically, first, the foregoing transparent conductive film is formed on the entire surface of the interlayer insulating film 14 by, for example, a sputtering method. Thereafter, a selective portion is removed with use of a photolithography method (through performing light exposure, development, post-baking, etc. on a photoresist film), for example, with use of dry etching or wet etching to form the lower electrode 15a. At this occasion, the lower electrode 15a is formed in a region facing the wiring layer 13a. Moreover, in processing of the transparent conductive film, the transparent conductive film remains also in a region facing the wiring layer 13b to form, together with the lower electrode 15a, the wiring layer 15b configuring a portion of a hole transmission path.

Subsequently, the insulating film 16 is formed. At this occasion, first, the insulating film 16 including the foregoing material is formed by, for example, a plasma CVD method on the entire surface of the semiconductor substrate 11 to cover the interlayer insulating film 14, the lower electrode 15a, and the wiring layer 15b. Thereafter, the formed insulating film 16 is polished by, for example, a CMP method to expose the lower electrode 15a and the wiring layer 15b from the insulating film 16 and to reduce (desirably eliminate) a difference in level between the lower electrode 15a and the insulating film 16, as illustrated in FIG. 7A.

Next, the organic photoelectric conversion layer 17 is formed on the lower electrode 15a, as illustrated in FIG. 7B. At this occasion, pattern formation of three kinds of organic semiconductor materials including the foregoing materials is performed by, for example, a vacuum deposition method. It is to be noted that in a case where another organic layer (such as an electron blocking layer) is formed above or below the organic photoelectric conversion layer 17 as described above, the organic layer is desirably formed continuously in a vacuum process (in-situ vacuum process). Moreover, the method of forming the organic photoelectric conversion layer 17 is not necessarily limited to a technique using the foregoing vacuum deposition method, and any other technique, for example, a print technology may be used.

Subsequently, the upper electrode 18 and the protective layer 19 are formed, as illustrated in FIG. 7C. First, the upper electrode 18 including the foregoing transparent conductive film is formed on an entire substrate surface by, for example, a vacuum deposition method or a sputtering method to cover a top surface and a side surface of the organic photoelectric conversion layer 17. It is to be noted that characteristics of the organic photoelectric conversion layer 17 easily vary by an influence of water, oxygen, hydrogen, etc.; therefore, the upper electrode 18 is desirably formed by an in-situ vacuum process together with the organic photoelectric conversion layer 17. Thereafter (before pattering the upper electrode 18), the protective layer 19 including the foregoing material is formed by, for example, a plasma CVD method to cover a top surface of the upper electrode 18. Subsequently, after the protective layer 19 is formed on the upper electrode 18, the upper electrode 18 is processed.

Thereafter, selective portions of the upper electrode 18 and the protective layer 19 are collectively removed by etching using a photolithography method. Subsequently, the contact hole H is formed in the protective layer 19 by, for example, etching using a photolithography method. At this occasion, the contact hole H is desirably formed in a region not facing the organic photoelectric conversion layer 17. Even after formation of the contact hole H, a photoresist is removed, and cleaning using a chemical solution is performed by a method similar to the foregoing method; therefore, the upper electrode 18 is exposed from the protective layer 19 in a region facing the contact hole H. Accordingly, in view of generation of a pin hole as described above, the contact hole H is desirably provided in a region other than a region where the organic photoelectric conversion layer 17 is formed. Subsequently, the contact metal layer 20 including the foregoing material is formed with use of, for example, a sputtering method. At this occasion, the contact metal layer 20 is formed on the protective layer 19 to be contained in the contact hole H and extend to a top surface of the wiring layer 15*b*. Lastly, the planarization layer 21 is formed on the entire surface of the semiconductor substrate 11, and thereafter, the on-chip lens 22 is formed on the planarization layer 21. Thus, the photoelectric conversion element 10 illustrated in FIG. 1 is completed.

In the foregoing photoelectric conversion element 10, for example, as the unit pixel P of the solid-state imaging device 1, signal electric charges are obtained as follows. As illustrated in FIG. 8, light L enters the photoelectric conversion element 10 through the on-chip lens 22 (not illustrated in FIG. 8), and thereafter, the light L passes through the organic photoelectric converter 11G and the inorganic photoelectric converters 11B and 11R in this order. Each of green light, blue light, and red light of the light L is subjected to photoelectric conversion in the course of passing. FIG. 9 schematically illustrates a flow of obtaining signal electric charges (electrons) on the basis of incident light. Hereinafter, description is given of a specific signal obtaining operation in each photoelectric converter.

(Obtaining of Green Signal by Organic Photoelectric Converter 11G)

First, green light Lg of the light L having entered the photoelectric conversion element 10 is selectively detected (absorbed) by the organic photoelectric converter 11G to be subjected to photoelectric conversion. Electrons Eg of thus-generated electron-hole pairs are extracted from the lower electrode 15*a*, and thereafter, the electrons Eg are stored in the green electric storage layer 110G through a transmission path A (the wiring layer 13*a* and the conductive plugs 120*a*1 and 120*a*2). The stored electrons Eg are transferred to the FD 116 in a reading operation. It is to be noted that holes Hg are discharged from the upper electrode 18 through a transmission path B (the contact metal layer 20, the wiring layers 13*b* and 15*b*, and the conductive plugs 120*b*1 and 120*b*2).

Specifically, the signal electric charges are stored as follows. Namely, in the present embodiment, a predetermined negative potential VL (<0 V) and a potential VU (<VL) lower than the potential VL are applied to the lower electrode 15*a* and the upper electrode 18, respectively. It is to be noted that the potential VL are applied to the lower electrode 15*a* from, for example, the wiring line 51*a* in the multilayer wiring layer 51 through the transmission path A. The potential VL is applied to the upper electrode 18 from, for example, the wiring line 51*a* in the multilayer wiring layer 51 through the transmission path B. Thus, in an electric charge storing state (an OFF state of the unillustrated reset transistor and the transfer transistor Tr1), electrons of the electron-hole pairs generated in the organic photoelectric conversion layer 17 are guided to the lower electrode 15*a* having a relatively high potential (holes are guided to the upper electrode 18). Thus, the electrons Eg are extracted from the lower electrode 15*a* to be stored in the green electric storage layer 110G (more specifically, the n-type region 115*n*) through the transmission path A. Moreover, storage of the electrons Eg changes the potential VL of the lower electrode 15*a* brought into conduction with the green electric storage layer 110G. A change amount of the potential VL corresponds to a signal potential (herein, a potential of a green signal).

Moreover, in a reading operation, the transfer transistor Tr1 is turned to an ON state, and the electrons Eg stored in the green electric storage layer 110G are transferred to the FD 116. Accordingly, a green signal based on a light reception amount of the green light Lg is read to the vertical signal line Lsig to be described later through an unillustrated other pixel transistor. Thereafter, the unillustrated reset transistor and the transfer transistor Tr1 are turned to an ON state, and the FD 116 as the n-type region and a storage region (the n-type region 115*n*) of the green electric storage layer 110G are reset to, for example, a power source voltage VDD.

(Obtaining of Blue Signal and Red Signal by Inorganic Photoelectric Converters 11B and 11R)

Next, blue light and red light of light having passed through the organic photoelectric converter 11G are absorbed in order by the inorganic photoelectric converter 11B and the inorganic photoelectric converter 11R, respectively, to be subjected to photoelectric conversion. In the inorganic photoelectric converter 11B, electrons Eb corresponding to the blue light having entered the inorganic photoelectric converter 11B are stored in the n-type region (the n-type photoelectric conversion layer 111*n*), and the stored electrons Ed are transferred to the FD 113 in the reading operation. It is to be noted that holes are stored in an unillustrated p-type region. Likewise, in the inorganic photoelectric converter 11R, electrons Er corresponding to the red light having entered the inorganic photoelectric converter 11R are stored in the n-type region (the n-type photoelectric conversion layer 112*n*), and the stored electrons Er are transferred to the FD 114 in the reading operation. It is to be noted that holes are stored in an unillustrated p-type region.

In the electric charge storing state, the negative potential VL is applied to the lower electrode 15*a* of the organic photoelectric converter 11G, as described above, which tends to increase a hole concentration in the p-type region (the p-type region 111*p* in FIG. 2) as a hole storage layer of the inorganic photoelectric converter 11B. This makes it possible to suppress generation of a dark current at an interface between the p-type region 11p and the interlayer insulating film 12.

In the reading operation, as with the foregoing organic photoelectric converter 11G, the transfer transistors Tr2 and Tr3 are turned to an ON state, and the electrons Eb stored in the n-type photoelectric conversion layer 111n and the electrons Er stored in the n-type photoelectric conversion layer 112n are transferred to the FDs 113 and 114, respectively. Accordingly, a blue signal based on a light reception amount of the blue light Lb and a red signal based on a light reception amount of the red light Lr are read to the vertical signal line Lsig to be described later through an unillustrated other pixel transistor. Thereafter, the unillustrated reset transistor and the transfer transistors Tr2 and Tr3 are turned to the ON state, and the FDs 113 and 114 as the n-type regions are reset to, for example, the power source voltage VDD.

As described above, the organic photoelectric converter 11G and the inorganic photoelectric converters 11B and 11R are stacked along the vertical direction, which makes it possible to separately detect red light, green light, and blue light without providing a color filter, thereby obtaining signal electric charges of respective colors. This makes it possible to suppress light loss (a decline in sensitivity) resulting from color light absorption by the color filter and generation of false color associated with pixel interpolation processing.

(1-3. Workings and Effects)

As described above, in recent years, in solid-state imaging devices such as CCD image sensors and CMOS image sensors, high color reproducibility, a high frame rate, and high sensitivity have been in demand. In order to achieve high color reproducibility, the high frame rate, and high sensitivity, a superior spectroscopic shape, high responsivity, and high external quantum efficiency (EQE) are in demand. In a solid-state imaging device in which a photoelectric converter including an organic material (an organic photoelectric converter) and a photoelectric converter including an inorganic material such as Si (an inorganic photoelectric converter) are stacked, the organic photoelectric converter extracts a signal of one color, and the inorganic photoelectric converter extracts signals of two colors, a bulk-hetero structure is used for the organic photoelectric converter. The bulk-hetero structure makes it possible to increase an electric charge separation interface by co-evaporation of the p-type organic semiconductor material and the n-type organic semiconductor material, thereby improving conversion efficiency. Hence, in a typical solid-state imaging device, improvements in the spectroscopic shape, responsivity and EQE of the organic photoelectric converter are achieved with use of two kinds of materials. In an organic photoelectric converter including two kinds of materials (binary system), for example, fullerenes and quinacridones or subphthalocyanines, or quinacridones and subphthalocyanines are used.

However, in general, a material having a sharp spectroscopic shape in a solid-state film tends not to have a high electric charge transporting property. In order to develop a high electric charge transporting property with use of a molecular material, it is necessary for respective orbitals configured of molecules to have an overlap in a solid state. In a case where interaction between the orbitals is developed, a shape of an absorption spectrum in the solid state is broadened. For example, diindenoperylenes have high hole mobility of about $10^{-2}$ cm$^2$/Vs maximum in a solid-state film thereof. In particular, a solid-state film of diindenoperylenes formed at a substrate temperature rising to 90° C. has high hole mobility, which results from change in crystallinity and orientation of diindenoperylenes. In a case where the solid-state film is formed at a substrate temperature of 90° C., a solid-state film that allows a current to easily flow toward a direction where π-stacking as one kind of intermolecular interaction is formed is formed. Thus, the material having strong interaction between molecules in a solid-state film easily develops higher electric charge mobility.

In contrast, it is known that diindenoperylenes have a sharp absorption spectrum in a case where diindenoperylenes are dissolved in an organic solvent such as dichloromethane, but exhibits a broad absorption spectrum in the solid-state film thereof. It is understood that in a solution, diindenoperylenes are diluted by dichloromethane, and are therefore in a single molecule state, whereas intermolecular interaction is developed in the solid-state film. It can be seen that a solid-state film having a sharp spectroscopic shape and high electric charge transporting property is difficult in principle.

Moreover, in the organic photoelectric converter having a binary bulk-hetero structure, electric charges (holes and electrons) generated at a P/N interface in the solid-state film are transported. The holes are transported by the p-type organic semiconductor material, and the electrons are transported by the n-type organic semiconductor material. Accordingly, in order to achieve high responsivity, it is necessary for both the p-type organic semiconductor material and the n-type organic semiconductor material to have a high electric charge transporting property. Hence, in order to achieve both a superior spectroscopic shape and high responsivity, it is necessary for one of the p-type organic semiconductor material and the n-type organic semiconductor material to have both sharp spectroscopic characteristics and high electric charge mobility. However, it is difficult to prepare a material having a sharp spectroscopic shape and a high electric charge transporting property due to the foregoing reason, and it is difficult to achieve a superior spectroscopic shape, high responsivity, and high EQE with use of two kinds of materials.

In contrast, in the present embodiment, the organic photoelectric conversion layer 17 is formed with use of three kinds of organic semiconductor materials having mother skeletons different from one another. Specifically, the three kinds of organic semiconductor materials are fullerene or a fullerene derivative (the first organic semiconductor material), an organic semiconductor material (the second organic semiconductor material) in a form of a single-layer film having a higher linear absorption coefficient of a maximal absorption wavelength in the visible light region than a single-layer film of the first organic semiconductor material and a single-layer film of the third organic semiconductor material, and an organic semiconductor material (the third organic semiconductor material) having a value equal to or higher than the HOMO level of the second organic semiconductor material. This makes it possible to entrust, to another material, one of the sharp spectroscopic shape and high electric charge mobility, which are expected of one or both of the p-type semiconductor and the n-type semiconductor in the binary system. Entrusting three characteristics including superior spectroscopic characteristics, hole mobility, and electron mobility to three kinds of materials, respectively, that is, functional separation makes it possible to achieve a sharp spectroscopic shape, high responsivity, and high external quantum efficiency. In other words, the first organic semiconductor material makes it possible to achieve high electron mobility, the second organic semiconductor material makes it possible to achieve high light absorption capacity and a sharp spectroscopic shape, and the third organic semiconductor material makes it possible to achieve high hole mobility.

As described above, in the present embodiment, the organic photoelectric conversion layer 17 is formed with use of the foregoing three kinds of organic semiconductor materials, i.e., the first organic semiconductor material, the second organic semiconductor material, and the third organic semiconductor material, which makes it possible to achieve the following effects. The first organic semiconductor material and the third organic semiconductor material make it possible to achieve high electric charge mobility, thereby improving responsivity. Transport efficiency of electric charges resulting from separation of excitons at an interface formed with use of a mixture of the first organic semiconductor material, the second organic semiconductor material, and the third organic semiconductor material is improved to cause an improvement in external quantum efficiency. The second organic semiconductor material makes it possible to achieve high light absorption capacity and a sharp spectroscopic shape. In other words, it is possible to provide a photoelectric conversion element achieving a superior spectroscopic shape, high responsivity, and high EQE, and a solid-state imaging device including the photoelectric conversion element.

It is to be noted that even in a case where the sharp spectroscopic shape is not necessary, the second organic semiconductor material has high light absorption capacity; therefore, it is expected that using the second organic semiconductor material together with the first organic semiconductor material and the third organic semiconductor material makes it possible to achieve the organic photoelectric conversion layer 17 having superior EQE and high responsivity.

Moreover, in the present embodiment, the organic photoelectric conversion layer 17 is configured with use of the foregoing three kinds of organic semiconductor materials (the first organic semiconductor material, the second organic semiconductor material, and the third organic semiconductor material); however, the organic photoelectric conversion layer 17 may include any material other than these materials. For example, an organic semiconductor material having the same mother skeleton as that of one of the first organic semiconductor material, the second organic semiconductor material, and the third organic semiconductor material and including a different substituent may be used as a fourth organic semiconductor material.

2. Application Examples

Application Example 1

FIG. 10 illustrates an entire configuration of a solid-state imaging device (the solid-state imaging device 1) using the photoelectric conversion element 10 described in the foregoing embodiment as the unit pixel P. The solid-state imaging device 1 is a CMOS image sensor, and includes a pixel section 1a as an imaging region and a peripheral circuit section 130 in a peripheral region of the pixel section 1a on the semiconductor substrate 11. The peripheral circuit section 130 includes, for example, a row scanning section 131, a horizontal selection section 133, a column scanning section 134, and a system controller 132.

The pixel section 1a includes, for example, a plurality of unit pixels P (each corresponding to the photoelectric conversion element 10) that are two-dimensionally arranged in rows and columns. The unit pixels P are wired with pixel driving lines Lread (specifically, row selection lines and reset control lines) for respective pixel rows, and are wired with vertical signal lines Lsig for respective pixel columns. The pixel driving lines Lread transmit drive signals for signal reading from the pixels. The pixel driving lines Lread each have one end coupled to corresponding one of output terminals, corresponding to the respective rows, of the row scanning section 131.

The row scanning section 131 includes a shift register and an address decoder, etc., and is, for example, a pixel driver that drives the pixels P of the pixel section 1a on a row basis. Signals are outputted from the pixels P of a pixel row selected and scanned by the row scanning section 131, and the thus-outputted signals are supplied to the horizontal selection section 133 through the respective vertical signal lines Lsig. The horizontal selection section 133 includes, for example, an amplifier and horizontal selection switches that are provided for the respective vertical signal lines Lsig.

The column scanning section 134 includes a shift register and an address decoder, etc., and drives the horizontal selection switches of the horizontal selection section 133 in order while sequentially performing scanning of those horizontal selection switches. Such selection and scanning performed by the column scanning section 134 allow the signals of the pixels P transmitted through the respective vertical signal lines Lsig to be sequentially outputted to a horizontal signal line 135. The thus-outputted signals are transmitted to outside of the semiconductor substrate 11 through the horizontal signal line 135.

A circuit portion configured of the row scanning section 131, the horizontal selection section 133, the column scanning section 134, and the horizontal signal line 135 may be provided directly on the semiconductor substrate 11, or may be disposed in an external control IC. Alternatively, the circuit portion may be provided in any other substrate coupled by means of a cable or any other coupler.

The system controller 132 receives, for example, a clock supplied from the outside of the semiconductor substrate 11 and data on instructions of operation modes, and outputs data such as internal information of the solid-state imaging device 1. Furthermore, the system controller 132 includes a timing generator that generates various timing signals, and performs drive control of peripheral circuits such as the row scanning section 131, the horizontal selection section 133, and the column scanning section 134 on the basis of the various timing signals generated by the timing generator.

Application Example 2

The foregoing solid-state imaging device 1 is applicable to various kinds of electronic apparatuses having imaging functions. Examples of the electronic apparatuses include camera systems such as digital still cameras and video cameras, and mobile phones having imaging functions. FIG. 11 illustrates, for purpose of an example, a schematic configuration of an electronic apparatus 2 (e.g., a camera). The electronic apparatus 2 is, for example, a video camera that allows for shooting of a still image or a moving image. The electronic apparatus 2 includes the solid-state imaging device 1, an optical system (e.g., an optical lens) 310, a shutter unit 311, a driver 313, and a signal processor 312. The driver 313 drives the solid-state imaging device 1 and the shutter unit 311.

The optical system 310 guides image light (i.e., incident light) from an object toward the pixel section 1a of the solid-state imaging device 1. The optical system 310 may include a plurality of optical lenses. The shutter unit 311 controls a period in which the solid-state imaging device 1 is irradiated with the light and a period in which the light is blocked. The driver 313 controls a transfer operation of the solid-state imaging device 1 and a shutter operation of the shutter unit 311. The signal processor 312 performs various signal processes on signals outputted from the solid-state imaging device 1. A picture signal Dout having been subjected to the signal processes is stored in a storage medium such as a memory, or is outputted to a unit such as a monitor.

3. Examples

Hereinafter, various samples of examples and comparative examples related to the embodiment of the present disclosure and modification examples thereof were fabricated, and spectroscopic characteristics, HOMO levels, hole mobility, external quantum efficiency (EQE), and responsivity of the samples were evaluated.

(Experiment 1: Evaluation of Spectroscopic Characteristics)

A glass substrate was cleaned by UV/ozone treatment. Quinacridone (QD; the formula (3-1)) was evaporated on the glass substrate by a resistance heating method in a vacuum of 1×10$^{-5}$ Pa or less with use of an organic evaporation apparatus while rotating a substrate holder. Evaporation speed was 0.1 nm/sec, and a film having a total thickness of 50 nm was formed as a sample 1. In addition, in place of using QD, a sample 2 using SubPcCl (the formula (6-1)), a sample 3 using C60 (the formula (1-1)), a sample 4 using αNPD (the formula (4-2)), a sample 5 using BTBT (the formula (5-1)), a sample 59 using BQD (the formula (3-2)), and a sample 60 using rubrene (the formula (8)) were fabricated, and spectroscopic characteristics of the respective samples were evaluated.

Transmittance and reflectivity for each wavelength were measured with use of an ultraviolet-visible spectrophotometer to determine absorptivity (%) of light absorbed by each of single-layer films as the spectroscopic characteristics. A linear absorption coefficient α (cm$^{-1}$) for each wavelength in each of the single-layer films was evaluated by the Lambert-Beer law using the light absorptivity and the thickness of the single-layer film as parameters.

FIG. 12 illustrates a relationship between a visible light region (herein, in a range from 450 nm to 700 nm both inclusive) and the linear absorption coefficient of the samples 1 to 5 and the samples 59 and 60. As can be seen from FIG. 12, SubPcCl as the second organic semiconductor material has a higher linear absorption coefficient of a maximal absorption wavelength in the visible light region, as compared with the other first and third organic semiconductor materials. It is to be noted that as long as each of the organic semiconductor materials is a compound having the same mother skeleton, a tendency of the absorption coefficient illustrated in FIG. 12 is maintained in general.

(Experiment 2-1: Evaluation of HOMO Level)

The HOMO levels of the organic semiconductor materials summarized in Table 2 mentioned above were calculated from respective single-layer films of QD (the formula (3-1)), αNPD (the formula (4-2)), BTBT (the formula (5-1)), SubPcOC$_6$F$_5$ (the formula (6-3)), Du-H (the following formula (7)), F$_6$SubPcCl (the formula (6-2)), BQD (the formula (3-2)), and rubrene (the formula (8)) with use of a method similar to that in the experiment 1. It is to be noted that a thickness of each of the respective single-layer films including the organic semiconductor materials was 20 nm.

[Chem. 12]

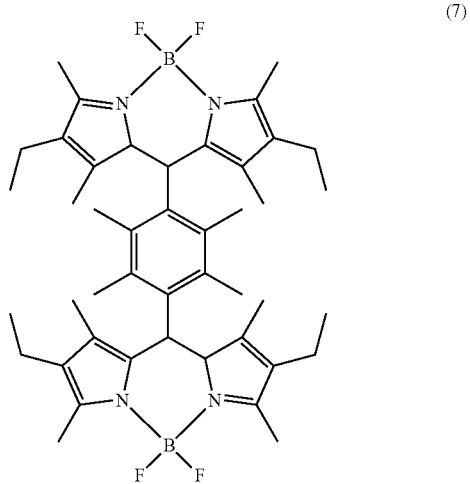

(7)

The HOMO level is a value obtained as follows. Ultraviolet light of 21.2 eV was applied to each of the samples to obtain a kinetic energy distribution of electrons emitted from a surface of the sample, and an energy width of a spectrum of the kinetic energy distribution was subtracted from an energy value of the applied ultraviolet light to obtain the HOMO level.

(Experiment 2-2: Evaluation of Hole Mobility)

Hole mobility of the organic semiconductor materials summarized in Table 3 mentioned above was calculated from samples fabricated by the following method. First, a glass substrate provided with a Pt electrode having a thickness of 50 nm was cleaned by UV/ozone treatment, and thereafter, a film of LiF having a total thickness of 0.5 nm was formed on the glass substrate. Subsequently, QD (the formula (3-1)) was evaporated by a resistance heating method in a vacuum of 1×10$^{-5}$ Pa or less with use of an organic evaporation apparatus while rotating a substrate holder. Evaporation speed was 0.1 nm/sec, and a film having a total thickness of 100 nm was formed. Next, a film of LiF having a total thickness of 0.5 nm was formed on the glass substrate, and thereafter, a film of Au having a thickness of 100 nm was formed by an evaporation method to cover a single-layer film of QD, thereby fabricating a photoelectric conversion element having a 1-mm by 1-mm photoelectric conversion region. As other samples, in place of the single-layer film of QD, photoelectric conversion elements including single-layer films of αNPD (the formula (4-2)), BTBT (the formula (5-1)), SubPcOC$_6$F$_5$ (the formula (6-3)), Du-H (the formula (7)), F$_6$SubPcCl (the formula (6-2)), BQD (the formula (3-2)), and rubrene (the formula (8)) were fabricated, and hole mobility of each of the samples was calculated.

The hole mobility was calculated with use of a semiconductor parameter analyzer. Specifically, a bias voltage to be applied between electrodes was swept from 0 V to −5 V to obtain a current-voltage curve. The curve was fit with a space charge limited current model to determine a relational expression between mobility and voltage, thereby obtaining a value of hole mobility at −1 V.

(Experiment 3: Evaluation of Spectroscopic Characteristics, External Quantum Efficiency, and Responsivity)

Experimental Example 3-1

First, as an example (a sample 6), an organic photoelectric conversion layer was formed as follows. A glass substrate provided with an ITO electrode having a thickness of 50 nm was cleaned by UV/ozone treatment, and thereafter, C60 (the formula (1-1)) as the first semiconductor material (a first kind), SubPcOC$_6$F$_5$ (the formula (6-3)) as the second organic semiconductor material (a second kind), and BQD (the formula (3-2)) as the third organic semiconductor material (a third kind) were evaporated simultaneously by a resistance heating method in a vacuum of 1×10$^{-5}$ Pa or less with use of an organic evaporation apparatus while rotating a substrate holder, thereby forming the organic photoelectric conversion layer. A film of C60, a film of SubPcO$_6$CF$_5$, and a film of BQD were formed at evaporation speed of 0.075 nm/sec, 0.075 nm/sec, and 0.05 nm/sec, respectively to have a total thickness of 100 nm. Moreover, a film of ITO having a thickness of 50 nm was formed on the organic photoelectric conversion layer by a sputtering method to fabricate a sample for evaluation of spectroscopic characteristics. Further, a film of AlSiCu having a thickness of 100 nm was formed on the organic photoelectric conversion layer by an evaporation method to fabricate a photoelectric conversion element including the film of AlSiCu as an upper electrode and having a 1-mm by 1-mm photoelectric conversion region. Furthermore, as a comparative example, a method similar to that in the sample 6 was used to fabricate a sample 7 in which the organic photoelectric conversion layer was formed using SubPcOC$_6$F$_5$ and BQD, a sample 8 in which the organic photoelectric conversion layer was formed using C60 and BQD, and a sample 9 in which the organic photoelectric conversion layer was formed using C60 and SubPcOC$_6$F$_5$, and spectroscopic characteristics, photoelectric conversion efficiency, and responsivity of each of the samples were evaluated as follows.

(Method of Evaluating Spectroscopic Characteristics)

The spectroscopic characteristics were evaluated with use of an ultraviolet-visible spectrophotometer. Transmittance and reflectivity for each wavelength were measured to determine light absorptivity (%) of light absorbed by the organic photoelectric conversion layer, and a linear absorption coefficient α (cm$^{-1}$) for each wavelength in the organic photoelectric conversion layer was evaluated by the Lambert-Beer law using the light absorptivity and the thickness of the organic photoelectric conversion layer as parameters. A spectroscopic characteristic diagram showing a spectroscopic shape was formed on the basis of the linear absorption coefficient α (cm$^{-1}$) for each wavelength, and two points of wavelength at which relative intensity was ⅓ of a peak value of an absorption band in the visible light region were determined, and a distance between the two points was calculated. As a indication of propriety of the spectroscopic shape, in a case where the distance between the two points is equal to or less than 115 nm, the spectroscopic shape was determined to be "Narrow", and in a case where the distance between the two points was larger than 115 nm, the spectroscopic shape was determined to be "Broad".

(Method of Evaluating External Quantum Efficiency)

External quantum efficiency was evaluated with use of a semiconductor parameter analyzer. Specifically, external quantum efficiency was calculated from a bright current value and a dark current value in a case where an amount of light to be applied from a light source to the photoelectric conversion element through a filter was 1.62 μW/cm$^2$, and a bias voltage to be applied between electrodes was −1 V.

(Method of Evaluating Responsivity)

Responsivity was evaluated on the basis of speed of falling, after stopping application of light, a bright current value observed during application of light with use of a semiconductor parameter analyzer. Specifically, an amount of light to be applied from a light source to the photoelectric conversion element through a filter was 1.62 μW/cm$^2$, and a bias voltage to be applied between electrodes was −1 V. A stationary current was observed in this state, and thereafter, application of light was stopped, and how the current was attenuated was observed. Subsequently, a dark current value was subtracted from an obtained current-time curve. A current-time curve to be thereby obtained was used, and time necessary for a current value after stopping application of light to attenuate to 3% of an observed current value in a stationary state was an indication of responsivity.

Moreover, as experimental examples 3-2 to 3-12, as with the foregoing experimental example 3-1, samples 10 to 39 and samples 44 to 55 as examples and comparative examples having other materials and other configurations were fabricated, and spectroscopic characteristics, photoelectric conversion efficiency, and responsivity of each of these samples were evaluated. Tables 4 to 6 provide summaries of configurations, spectroscopic shapes (stereoscopic characteristics), photoelectric conversion efficiency, and responsivity of the organic photoelectric conversion layers of the samples 6 to 39 and the samples 44 to 55. It is to be noted that the sample 36 is an example of a photoelectric conversion layer including four kinds of organic semiconductor materials that included the foregoing fourth organic semiconductor material. Herein, as the fourth organic semiconductor material, one kind was further selected from the first organic semiconductor materials. Moreover, a numerical value given in each of the comparative examples in Tables 4 to 6 is a relative value in a case where a value of the example in each material configuration was 1.0.

TABLE 4

| | | Organic Photoelectric Conversion Layer | | | | | | Characteristic Particularly |
| | | First Kind | Second Kind | Third Kind | Spectroscopic Shape | EQE | Responsivity | Inferior to Example |
|---|---|---|---|---|---|---|---|---|
| Experimental Example 3-1 | Sample 6 | Formula (1-1) 25% | Formula (6-3) 37.5% | Formula (3-2) 37.5% | Narrow | 1.00 | 1.0 | — |
| | Sample 7 | — — | Formula (6-3) 50% | Formula (3-2) 50% | Narrow | 0.45 | 3.0 | Response Speed |
| | Sample 8 | Formula (1-1) 75% | — — | Formula (3-2) 25% | Board | 0.62 | 1.0 | Spectroscopic Shape |
| | Sample 9 | Formula (1-1) 25% | Formula (6-3) 75% | — — | Narrow | 0.37 | 2.0 | EQE |

TABLE 4-continued

| | | Organic Photoelectric Conversion Layer | | | | | | Characteristic Particularly |
|---|---|---|---|---|---|---|---|---|
| | | First Kind | Second Kind | Third Kind | Spectroscopic Shape | EQE | Responsivity | Inferior to Example |
| Experimental Example 3-2 | Sample 10 | Formula (1-1) 25% | Formula (6-1) 37.5% | Formula (3-2) 37.5% | Narrow | 1.00 | 1.0 | — |
| | Sample 11 | — — | Formula (6-1) 50% | Formula (3-2) 50% | Narrow | 0.37 | 4.0 | Response Speed |
| | Sample 12 | Formula (1-1) 75% | — — | Formula (3-2) 25% | Board | 0.70 | 1.0 | Spectroscopic Shape |
| | Sample 13 | Formula (1-1) 25% | Formula (6-1) 75% | — — | Narrow | 0.61 | 10.0 | EQE |
| Experimental Example 3-3 | Sample 14 | Formula (1-1) 25% | Formula (6-4) 37.5% | Formula (3-2) 37.5% | Narrow | 1.00 | 1.0 | — |
| | Sample 15 | — — | Formula (6-4) 50% | Formula (3-2) 50% | Narrow | 0.84 | 2.0 | Response Speed |
| | Sample 16 | Formula (1-1) 75% | — — | Formula (3-2) 25% | Board | 0.64 | 2.5 | Spectroscopic Shape |
| | Sample 17 | Formula (1-1) 25% | Formula (6-4) 75% | — — | Narrow | 0.00 | Undetectable | EQE |
| Experimental Example 3-4 | Sample 18 | Formula (1-1) 25% | Formula (6-2) 37.5% | Formula (3-2) 37.5% | Narrow | 1.00 | 1.0 | — |
| | Sample 19 | — — | Formula (6-2) 50% | Formula (3-2) 50% | Narrow | 0.92 | 2.0 | Response Speed |
| | Sample 20 | Formula (1-1) 75% | — — | Formula (3-2) 25% | Board | 0.64 | 3.0 | Spectroscopic Shape |
| | Sample 21 | Formula (1-1) 25% | Formula (6-2) 75% | — — | Narrow | 0.00 | Undetectable | EQE |

TABLE 5

| | | Organic Photoelectric Conversion Layer | | | Spectroscopic Shape | EQE | Responsivity | Characteristic Particularly Inferior to Example |
|---|---|---|---|---|---|---|---|---|
| | | First Kind | Second Kind | Third Kind | | | | |
| Experimental Example 3-5 | Sample 22 | Formula (1-1) 25% | Formula (6-2) 37.5% | Formula (3-1) 37.5% | Narrow | 1.00 | 1.0 | — |
| | Sample 23 | — | Formula (6-2) 50% | Formula (3-1) 50% | Narrow | 0.85 | 4.0 | Response Speed |
| | Sample 24 | Formula (1-1) 25% | — | Formula (3-1) 75% | Board | 0.87 | 5.0 | Spectroscopic Shape |
| | Sample 25 | Formula (1-1) 25% | Formula (6-2) 75% | — | Narrow | 0.00 | Undetectable | EQE |
| Experimental Example 3-6 | Sample 26 | Formula (1-1) 25% | Formula (6-2) 37.5% | Formula (4-2) 37.5% | Narrow | 1.00 | 1.0 | — |
| | Sample 27 | — | Formula (6-2) 50% | Formula (4-2) 50% | Narrow | 0.73 | 10.0 | Response Speed |
| | Sample 28 | Formula (1-1) 25% | Formula (6-2) 75% | — | Narrow | 0.00 | Undetectable | EQE |
| Experimental Example 3-7 | Sample 29 | Formula (1-1) 25% | Formula (6-2) 37.5% | Formula (5-1) 37.5% | Narrow | 1.00 | 1.0 | — |
| | Sample 30 | — | Formula (6-2) 50% | Formula (5-1) 50% | Narrow | 0.37 | 10.0 | Response speed |
| | Sample 31 | Formula (1-1) 25% | Formula (6-2) 75% | — | Narrow | 0.00 | Undetectable | EQE |
| Experimental Example 3-8 | Sample 32 | Formula (2-1) 25% | Formula (6-3) 37.5% | Formula (3-2) 37.5% | Narrow | 1.00 | 1.0 | — |
| | Sample 33 | — | Formula (6-3) 50% | Formula (3-2) 50% | Narrow | 0.40 | 5.0 | Response Speed |

TABLE 5-continued

| | | Organic Photoelectric Conversion Layer | | | Spectroscopic | | | Characteristic Particularly Inferior to |
|---|---|---|---|---|---|---|---|---|
| | | First Kind | Second Kind | Third Kind | Shape | EQE | Responsivity | Example |
| | Sample 34 | Formula (2-1) 25% | — | Formula (3-2) 75% | Board | 0.65 | 4.0 | Spectroscopic Shape |
| | Sample 35 | Formula (2-1) 25% | Formula (6-3) 75% | — | Narrow | 0.37 | 8.0 | EQE |
| Experimental Example 3-9 | Sample 36 | Formula (1-1) + Formula (2-1) 25% | Formula (6-3) 37.5% | Formula (3-2) 37.5% | Narrow | 1.00 | 1.0 | — |
| | Sample 37 | — | Formula (6-3) 50% | Formula (3-2) 50% | Narrow | 0.43 | 6.0 | Response Speed |
| | Sample 38 | Formula (1-1) + Formula (2-1) 25% | — | Formula (3-2) 75% | Board | 0.62 | 4.0 | Spectroscopic Shape |
| | Sample 39 | Formula (1-1) + Formula (2-1) 25% | Formula (6-3) 75% | — | Narrow | 0.33 | 6.0 | EQE |

TABLE 6

| | | Organic Photoelectric Conversion Layer | | | | | | Characteristic Particularly |
|---|---|---|---|---|---|---|---|---|
| | | First Kind | Second Kind | Third Kind | Spectroscopic Shape | EQE | Responsivity | Inferior to Example |
| Experimental Example 3-10 | Sample 44 | Formula (1-1) 25% | Formula (6-2) 37.5% | Formula (3-3) 37.5% | Narrow | 1.00 | 1.0 | — |
| | Sample 45 | — | Formula (6-2) 50% | Formula (3-3) 50% | Narrow | 0.64 | 10.0 | Response Speed |
| | Sample 46 | Formula (1-1) 25% | — | Formula (3-3) 75% | Board | 0.43 | 20.0 | Spectroscopic Shape |
| | Sample 47 | Formula (1-1) 25% | Formula (6-2) 75% | — | Narrow | 0.00 | Undetectable | External Quantum Efficiency |
| Experimental Example 3-11 | Sample 48 | Formula (1-1) 25% | Formula (6-5) 37.5% | Formula (3-2) 37.5% | Narrow | 1.00 | 1.0 | — |
| | Sample 49 | — | Formula (6-5) 50% | Formula (3-2) 50% | Narrow | 0.84 | 1.8 | Response Speed |
| | Sample 50 | Formula (1-1) 25% | — | Formula (3-2) 75% | Board | 0.67 | 2.5 | Spectroscopic Shape |
| | Sample 51 | Formula (1-1) 25% | Formula (6-5) 75% | — | Narrow | 0.00 | Undetectable | External Quantum Efficiency |
| Experimental Example 3-12 | Sample 52 | Formula (1-1) 25% | Formula (6-5) 37.5% | — | Narrow | 0.00 | Undetectable | External Quantum Efficiency |
| | Sample 53 | Formula (1-1) 25% | Formula (6-2) 37.5% | Formula (8) 37.5% | Narrow | 1.00 | 1 | — |
| | Sample 54 | Formula (1-1) 25% | — | Formula (8) 75% | Board | 1.60 | 3 | Spectroscopic Shape |
| | Sample 55 | Formula (1-1) 25% | Formula (6-2) 75% | — | Narrow | 0.00 | Undetectable | External Quantum Efficiency |

As can be seen from Tables 4 to 6, as compared with a sample (the example, e.g. the sample 6) having a configuration of the photoelectric conversion element of the foregoing embodiment, in samples (the comparative examples, e.g., the samples 7 to 9) including two kinds of organic semiconductor materials selected from the three kinds of organic semiconductor materials used in the sample 6, one characteristic of the spectroscopic shape, response speed, and EQE was inferior. In other words, it was found that the organic photoelectric conversion layer configured using three kinds of organic semiconductor materials made it possible to achieve a superior spectroscopic shape, high response speed, and high EQE.

(Experiment 4: Regarding Composition Ratio and Combination of Organic Semiconductor Materials)

Experimental Examples 4-1 to 4-3

In an experimental example 4-1, samples 61, 40, and 41 in which the composition ratio of the first organic semiconductor material, the second organic semiconductor material, and the third organic semiconductor material was changed were fabricated, and spectroscopic characteristics, photoelectric conversion efficiency, and responsivity of each of the samples were evaluated. In an experimental example 4-2, a photoelectric conversion element that included an organic photoelectric conversion layer using, as the second organic semiconductor material, a material (the formula (4-2)) in a form of a single-layer film having a lower linear absorption coefficient of a maximal absorption wavelength in the visible light region than a single-layer film of the first organic semiconductor material and a single-layer film of the third organic semiconductor material to be described later was fabricated (a sample 42), and spectroscopic characteristics, photoelectric conversion efficiency, and responsivity of the photoelectric conversion element were evaluated on the basis of the sample 6. In an experimental example 4-3, a photoelectric conversion element that included an organic photoelectric conversion layer using, as the third organic semiconductor material, a material (the formula (7)) having a lower HOMO level than a HOMO level of the second organic semiconductor material was fabricated (a sample 43), and spectroscopic characteristics, photoelectric conversion efficiency, and responsivity of the photoelectric conversion element were evaluated on the basis of the sample 6. The compositions and evaluation of the respective samples in the respective experimental examples are summarized in Table 7.

As can be seen from results in the experimental example 4-1, in order to keep a sharp spectroscopic shape, the composition ratio of the first organic semiconductor material was desirably less than 40%. As can be seen from results in the experimental example 4-2, in order to achieve a sharp spectroscopic shape and high EQE, the second organic semiconductor material in the form of the single-layer film desirably had a higher linear absorption coefficient of the maximal absorption wavelength in the visible light region than each of the single-layer film of the first organic semiconductor material and the single-layer film of the third organic semiconductor material. As can be seen from results in the experimental example 4-3, in order to achieve high response speed, as the third organic semiconductor material, a material having a HOMO level equal to or higher than the HOMO level of the second organic semiconductor material was desirably selected.

(Experiment 5: Regarding Third Organic Semiconductor Material)

In an experimental example 5, C60 (the formula (1-1)) as the first organic semiconductor material (the first kind), SubPcOCl (the formula (6-2)) as the second organic semiconductor material (the second kind), and QD (the formula (3-1)) as the third organic semiconductor material (the third kind) were used to fabricate a photoelectric conversion element (a sample 56) having a 1-mm by 1-mm photoelectric conversion region with use of a method similar to that in the foregoing experiment 3. Moreover, as samples 57 and 58, photoelectric conversion elements having the same configuration as that of the sample 56, except that αNPD (the formula (4-2); the sample 57) and rubrene (the formula (8); the sample 58) were used in place of QD. Spectroscopic characteristics, the photoelectric conversion efficiency, and responsivity of these samples 56 to 58 were evaluated, and results of the evaluation were summarized in Table 8.

TABLE 7

| | | Organic Photoelectric Conversion Layer | | | | | | Characteristic Particularly |
| --- | --- | --- | --- | --- | --- | --- | --- | --- |
| | | First Kind | Second Kind | Third Kind | Spectroscopic Shape | EQE | Responsivity | Inferior to Example |
| Experimental Example 4-1 | Sample 61 | Formula (1-1) 20% | Formula (6-3) 40% | Formula (3-2) 40% | Narrow | 1.00 | 1.0 | — |
| | Sample 40 | Formula (1-1) 35% | Formula (6-3) 32.5% | Formula (3-2) 32.5% | Narrow | 1.00 | 0.9 | — |
| | Sample 41 | Formula (1-1) 40% | Formula (6-3) 30% | Formula (3-2) 30% | Board | 1.00 | 0.9 | Spectroscopic Shape |
| Experimental Example 4-2 | Sample 6 | Formula (1-1) 25% | Formula (6-3) 37.5% | Formula (3-2) 37.5% | Narrow | 1.00 | 1.0 | — |
| | Sample 42 | Formula (1-1) 25% | Formula (4-2) 37.5% | Formula (5-1) 37.5% | Board | 0.10 | 2.0 | Spectroscopic Shape, EQE |
| Experimental Example 4-3 | Sample 6 | Formula (1-1) 25% | Formula (6-3) 37.5% | Formula (3-2) 37.5% | Narrow | 1.00 | 1.0 | — |
| | Sample 43 | Formula (1-1) 25% | Formula (6-3) 37.5% | Formula (7) 37.5% | Narrow | 0.60 | 10.0 | Response Speed |

TABLE 8

| | Organic Photoelectric Conversion Layer | | | Spectroscope Shape | EQE | Responsivity |
|---|---|---|---|---|---|---|
| | First Kind | Second Kind | Third Kind | | | |
| Sample 56 | Formula (1-1) 25% | Formula (6-2) 37.5% | Formula (3-1) 37.5% | Narrow | 1.00 | 1.0 |
| Sample 57 | Formula (1-1) 25% | Formula (6-2) 37.5% | Formula (9) 37.5% | Narrow | 0.30 | 5.0 |
| Sample 58 | Formula (1-1) 25% | Formula (6-2) 37.5% | Formula (8) 37.5% | Narrow | 0.13 | 30.0 |

In the present experiment, the sample 56 using QD as the third organic semiconductor material exhibited the most favorable values in both responsivity and EQE. Subsequently, the sample 57 using αNPD as the third organic semiconductor material exhibited favorable values in both responsivity and EQE. In the sample 58 using rubrene, the values of responsivity and EQE were lower than those in the samples 56 and 57. It is understood that, a reason regarding responsivity is that an organic semiconductor material including a hetero element (herein, QD and αNPD) has a property of easily maintaining higher electric charge (in particular, hole) mobility than an organic semiconductor material including carbon and hydrogen (herein, rubrene). It is understood that a reason regarding EQE is that excitons generated through light absorption are separated more efficiently at an interface formed by the organic semiconductor material including a hetero element and any other organic semiconductor material than at an interface formed by the organic semiconductor material including carbon and hydrogen and any other organic semiconductor material. This indicates that an organic semiconductor material including a hetero element in a molecule of the organic semiconductor material is preferably used as the third organic semiconductor material. Moreover, this indicates that an organic semiconductor material including a chalcogen element in a molecule of the organic semiconductor material is more preferable. Further, this indicates that an organic semiconductor material including a hetero element in a ring is more preferable.

Although the description has been given by referring to the embodiment, the modification examples, and the examples, the contents of the present disclosure are not limited to the embodiment, the modification examples, and the examples, and may be modified in a variety of ways. For example, the foregoing embodiment has exemplified, as the photoelectric conversion element (the solid-state imagine device), a configuration in which the organic photoelectric converter 11G detecting green light and the inorganic photoelectric converters 11B and 11R respectively detecting blue light and red light are stacked; however, the contents of the present disclosure is not limited thereto. More specifically, the organic photoelectric converter may detect red light or blue light, and the inorganic photoelectric converter may detect green light.

Moreover, the number of organic photoelectric converters, the number of inorganic photoelectric converters, a ratio between the organic photoelectric converters and the inorganic photoelectric converters are not limited, and two or more organic photoelectric converters may be provided, or color signals of a plurality of colors may be obtained by only the organic photoelectric converter. Further, the contents of the present disclosure is not limited to a configuration in which organic photoelectric converters and inorganic photoelectric converters are stacked along the vertical direction, and organic photoelectric converters and inorganic photoelectric converters may be disposed side by side along a substrate surface.

Furthermore, the foregoing embodiment has exemplified the configuration of the back-side illumination type solid-state imaging device; however, the contents of the present disclosure are applicable to a front-side illumination type solid-state imaging device. Further, it may not be necessary for the solid-state imaging device (the photoelectric conversion element) of the present disclosure to include all components described in the foregoing embodiment, and the solid-state imaging device of the present disclosure may include any other layer.

Note that the effects described herein are illustrative and non-limiting, and effects to be achieved by the present disclosure may be effects other than those described herein.

It is to be noted that the present technology may have the following configurations.

[1]

A photoelectric conversion element, including:

a first electrode and a second electrode facing each other; and a photoelectric conversion layer provided between the first electrode and the second electrode, and including a first organic semiconductor material, a second organic semiconductor material, and a third organic semiconductor material that have mother skeletons different from one another, the first organic semiconductor material being one of fullerenes and fullerene derivatives, the second organic semiconductor material in a form of a single-layer film having a higher linear absorption coefficient of a maximal light absorption wavelength in a visible light region than a single-layer film of the first organic semiconductor material and a single-layer film of the third organic semiconductor material, and the third organic semiconductor material having a value equal to or higher than a HOMO level of the second organic semiconductor material.

[2]

The photoelectric conversion element according to [1], in which the third organic semiconductor material in a form of a single-layer film has higher hole mobility than hole mobility of a single-layer film of the second organic semiconductor material.

[3]

The photoelectric conversion element according to [1] or [2], in which in the photoelectric conversion layer, excitons generated through light absorption by the second organic semiconductor material are separated at an interface between two organic semiconductor materials selected from the first organic semiconductor material, the second organic semiconductor material, and the third organic semiconductor material.

[4]

The photoelectric conversion element according to any one of [1] to [3], in which the photoelectric conversion layer has a maximal absorption wavelength in a range from 450 nm to 650 nm both inclusive.

[5]

The photoelectric conversion element according to any one of [1] to [4], wherein the third organic semiconductor material includes a hetero element other than carbon (C) and hydrogen (H) in a molecule of the third organic semiconductor material.

[6]

The photoelectric conversion element according to any one of [1] to [5], in which the photoelectric conversion layer includes the first organic semiconductor material in a range from 10 vol % to 35 vol % both inclusive.

[7]

The photoelectric conversion element according to any one of [1] to [6], in which the photoelectric conversion layer includes the second organic semiconductor material in a range from 30 vol % to 80 vol % both inclusive.

[8]

The photoelectric conversion element according to any one of [1] to [7], in which the photoelectric conversion layer includes the third organic semiconductor material in a range from 10 vol % to 60 vol % both inclusive.

[9]

The photoelectric conversion element according to any one of [1] to [8], in which one of the second organic semiconductor material and the third organic semiconductor material is a quinacridone derivative represented by the following formula (1):

[Chem. 1]

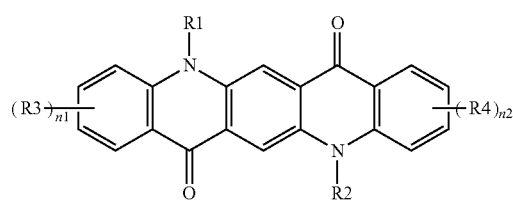

(1)

where each of R1 and R2 is independently one of a hydrogen atom, an alkyl group, an aryl group, and a heterocyclic group, each of R3 and R4 is independently one of an alkyl chain, an alkenyl group, an alkynyl group, an aryl group, a cyano group, a nitro group, and a silyl group, and two or more of R3 or two or more of R4 optionally form a ring together, and each of n1 and n2 is independently 0 or an integer of 1 or more.

[10]

The photoelectric conversion element according to any one of [1] to [8], in which one of the second organic semiconductor material and the third organic semiconductor material is one of a triallylamine derivative represented by the following formula (3) and a benzothienobenzothiophene derivative represented by the following formula (4):

[Chem. 2]

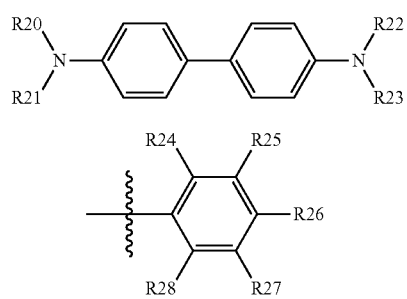

(2)

(2)' where each of R20 to R23 is independently a substituent represented by a formula (2)', each of R24 to R28 is independently one of a hydrogen atom, a halogen atom, an aryl group, an aromatic hydrocarbon ring group, an aromatic hydrocarbon ring group having an alkyl chain or a substituent, an aromatic heterocyclic group, and an aromatic heterocyclic group having an alkyl chain or a substituent, adjacent ones of R24 to R28 are optionally saturated or unsaturated divalent groups that are bound to one another to form a ring, and

[Chem. 3]

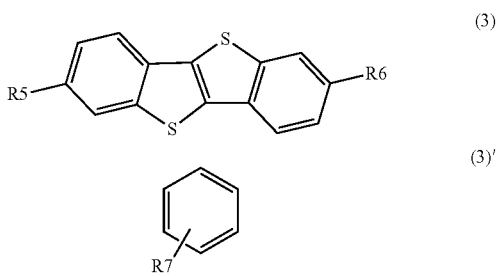

(3)

(3)' where each of R5 and R6 is independently one of a hydrogen atom and a substituent represented by a formula (3)', and R7 is one of an aromatic ring group and an aromatic ring group having a substituent.

[11]

The photoelectric conversion element according to any one of [1] to [8], in which one of the second organic semiconductor material and the third organic semiconductor material is a subphthalocyanine derivative represented by the following formula (4):

[Chem. 4]

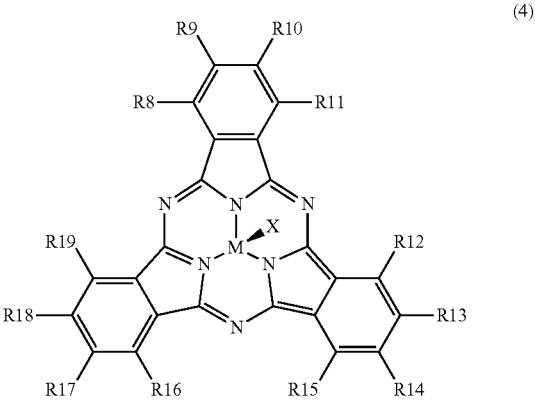

(4)

where each of R8 to R19 is independently selected from a group configured of a hydrogen atom, a halogen atom, a straight-chain, branched, or cyclic alkyl group, a thioalkyl group, a thioaryl group, an arylsulfonyl group, an alkylsulfonyl group, an amino group, an alkylamino group, an arylamino group, a hydroxy group, an alkoxy group, an acylamino group, an acyloxy group, a phenyl group, a carboxy group, a carboxyamide group, a carboalkoxy group, an acyl group, a sulfonyl group, a cyano group, and a nitro group, any adjacent ones of R8 to R19 are optionally part of a condensed aliphatic ring or a condensed aromatic ring, the condensed aliphatic ring or the condensed aromatic ring optionally includes one or more atoms other than carbon, M is one of boron and a divalent or trivalent metal, and X is an anionic group.

[12]

The photoelectric conversion element according to any one of [1] to [9] and [11], in which the second organic semiconductor material is a subphthalocyanine derivative, and the third organic semiconductor material is a quinacridone derivative.

[13]

The photoelectric conversion element according to any one of [1] to [8], [10], and [11], in which the second organic semiconductor material is a subphthalocyanine derivative, and the third organic semiconductor material is a triallylamine derivative or a benzothienobenzothiophene derivative.

[14]

The photoelectric conversion element according to any one of [1] to [13], in which the fullerenes and the fullerene derivatives are represented by one of the following formulas (5) and (6):

[Chem. 5]

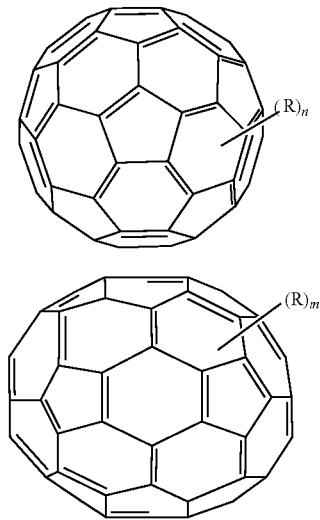

(5)

(6)

where each R is independently one of a hydrogen atom, a halogen atom, a straight-chain, branched, or cyclic alkyl group, a phenyl group, a group having a straight-chain or condensed ring aromatic compound, a group having a halide, a partial fluoroalkyl group, a perfluoroalkyl group, a silylalkyl group, a silyl alkoxy group, an arylsilyl group, an arylsulfanyl group, an alkylsulfanyl group, an arylsulfonyl group, an alkylsulfonyl group, an arylsulfide group, an alkylsulfide group, an amino group, an alkylamino group, an arylamino group, a hydroxy group, an alkoxy group, an acylamino group, an acyloxy group, a carbonyl group, a carboxy group, a carboxyamide group, a carboalkoxy group, an acyl group, a sulfonyl group, a cyano group, a nitro group, a group having a chalcogenide, a phosphine group, a phosphone group, and derivatives thereof, and each of "n" and "m" is 0 or an integer of 1 or more.

[15]

The photoelectric conversion element according to any one of [1] to [14], in which the photoelectric conversion layer includes a fourth organic semiconductor material having the same mother skeleton as the mother skeleton of one of the first organic semiconductor material, the second organic semiconductor material, and the third organic semiconductor material, and having a different substituent.

[16]

The photoelectric conversion element according to any one of [1] to [15], in which the visible light region is in a range from 450 nm to 800 nm both inclusive.

[17]

A solid-state imaging device provided with pixels each including one or more organic photoelectric converters, each of the organic photoelectric converters including:
  a first electrode and a second electrode facing each other; and
  a photoelectric conversion layer provided between the first electrode and the second electrode, and including a first organic semiconductor material, a second organic semiconductor material, and a third organic semiconductor material that have mother skeletons different from one another,
  the first organic semiconductor material being one of fullerenes and fullerene derivatives,
  the second organic semiconductor material in a form of a single-layer film having a higher linear absorption coefficient of a maximal light absorption wavelength in a visible light region than a single-layer film of the first organic semiconductor material and a single-layer film of the third organic semiconductor material, and
  the third organic semiconductor material having a value equal to or higher than a HOMO level of the second organic semiconductor material.

[18]

The solid-state imaging device according to [17], in which the one or more organic photoelectric converters, and one or more inorganic photoelectric converters that performs photoelectric conversion in a wavelength region different from a wavelength region of the organic photoelectric converters are stacked in each of the pixels.

[19]

The solid-state imaging device according to [18], in which
  the one or more inorganic photoelectric converters are formed to be embedded in a semiconductor substrate, and
  the one or more organic photoelectric converters are formed on first surface side of the semiconductor substrate.

[20]

The solid-state imaging device according to [19], in which
  the one or more organic photoelectric converters perform photoelectric conversion on green light, and
  an inorganic photoelectric converter that performs photoelectric conversion on blue light and an inorganic photoelectric converter that performs photoelectric conversion on red light are stacked in the semiconductor substrate.

This application is based upon and claims the benefit of priority of Japanese Patent Application No. 2015-110900 filed in the Japan Patent Office on May 29, 2015 and Japanese Patent Application No. 2016-072197 filed in the Japan Patent Office on Mar. 31, 2016, the entire contents of which are incorporated herein by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A photoelectric conversion element, comprising:
a first electrode and a second electrode facing each other; and
a photoelectric conversion layer provided between the first electrode and the second electrode, and including a first organic semiconductor material, a second organic semiconductor material, and a third organic semiconductor material that have mother skeletons different from one another,
wherein the first organic semiconductor material is fullerene,
wherein the second organic semiconductor material formed as a single-layer film has a linear absorption coefficient of a maximal light absorption wavelength in a visible light region higher than a linear absorption coefficient of a maximal light absorption wavelength in the visible light region of a single-layer film of the first organic semiconductor material and a linear absorption coefficient of a maximal light absorption wavelength in the visible light region of a single-layer film of the third organic semiconductor material,
wherein the third organic semiconductor material is a hole-transporting material, and
wherein the linear absorption coefficient of the maximal light absorption wavelength in the visible light region of the second organic semiconductor material is more than ten times a linear absorption coefficient of a wavelength with 450 nm of the second organic semiconductor material.

2. The photoelectric conversion element according to claim 1, wherein the fullerene comprises C60 fullerene.

3. The photoelectric conversion element according to claim 1, wherein the fullerene comprises C70 fullerene.

4. The photoelectric conversion element according to claim 1, wherein the fullerene comprises C60 fullerene and C70 fullerene.

5. The photoelectric conversion element according to claim 1, wherein the third organic semiconductor material when formed as a single-layer film has a higher hole mobility than a hole mobility of the single-layer film of the second organic semiconductor material.

6. The photoelectric conversion element according to claim 1, wherein the third organic semiconductor material has a value equal to or higher than a highest occupied molecular orbital (HOMO) level of the second organic semiconductor material.

7. The photoelectric conversion element according to claim 1, wherein in the photoelectric conversion layer, excitons generated through light absorption by the second organic semiconductor material are separated at an interface between two organic semiconductor materials selected from the first organic semiconductor material, the second organic semiconductor material, and the third organic semiconductor material.

8. The photoelectric conversion element according to claim 1, wherein the photoelectric conversion layer has a maximal absorption wavelength in a range from 450 nm to 650 nm, both inclusive.

9. The photoelectric conversion element according to claim 1, wherein the third organic semiconductor material includes a hetero element other than carbon (C) and hydrogen (H) in a molecule of the third organic semiconductor material.

10. The photoelectric conversion element according to claim 1, wherein the photoelectric conversion layer includes the first organic semiconductor material in a range from 10 vol % to 35 vol %, both inclusive.

11. The photoelectric conversion element according to claim 1, wherein the photoelectric conversion layer includes the second organic semiconductor material in a range from 30 vol % to 80 vol %, both inclusive.

12. The photoelectric conversion element according to claim 1, wherein the photoelectric conversion layer includes the third organic semiconductor material in a range from 10 vol % to 60 vol %, both inclusive.

13. The photoelectric conversion element according to claim 1, wherein one of the second organic semiconductor material and the third organic semiconductor material is a quinacridone derivative represented by the following formula (1):

[Chem. 1]

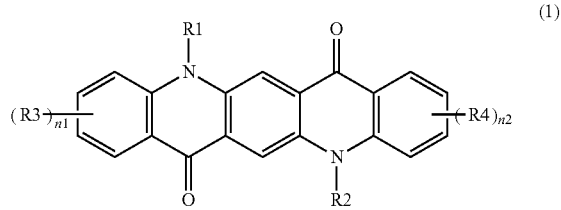

where each of R1 and R2 is independently one of a hydrogen atom, an alkyl group, an aryl group, and a heterocyclic group, each of R3 and R4 is independently one of an alkyl chain, an alkenyl group, an alkynyl group, an aryl group, a cyano group, a nitro group, and a silyl group, and two or more of R3 or two or more of R4 optionally form a ring together, and each of n1 and n2 is independently 0 or an integer of 1 or more.

14. The photoelectric conversion element according to claim 1, wherein one of the second organic semiconductor material and the third organic semiconductor material is one of a triallylamine derivative represented by the following formula (2) and a benzothienobenzothiophene derivative represented by the following formula (3):

[Chem. 2]

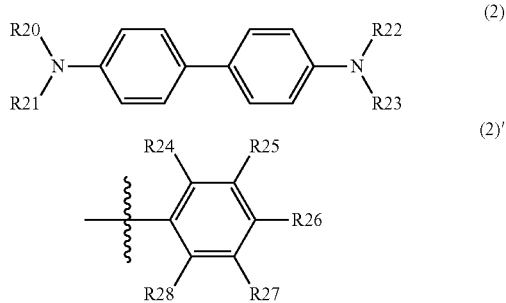

where each of R20 to R23 is independently a substituent represented by a formula (2)', each of R24 to R28 is independently one of a hydrogen atom, a halogen atom, an aryl group, an aromatic hydrocarbon ring group, an aromatic hydrocarbon ring group having an alkyl chain or a substituent, an aromatic heterocyclic group, and an aromatic heterocyclic group having an alkyl chain or a substituent, adjacent ones of R24 to R28 are optionally saturated or unsaturated divalent groups that are bound to one another to form a ring, and

[Chem. 3]

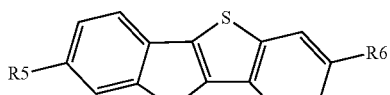
(3)

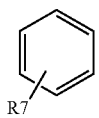
(3)' where each of R5 and R6 is independently one of a hydrogen atom and a substituent represented by a formula (3)', and R7 is one of an aromatic ring group and an aromatic ring group having a substituent.

15. The photoelectric conversion element according to claim 1, wherein one of the second organic semiconductor material and the third organic semiconductor material is a subphthalocyanine derivative represented by the following formula (4):

[Chem. 4]

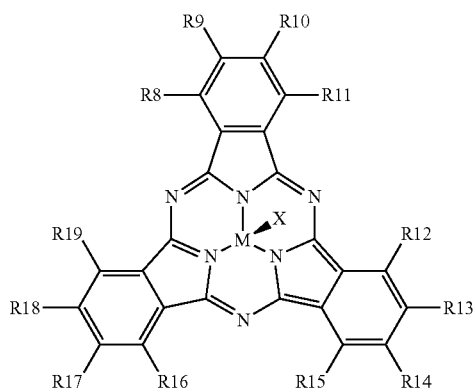
(4)

where each of R8 to R19 is independently selected from a group consisting of a hydrogen atom, a halogen atom, a straight-chain, branched, or cyclic alkyl group, a thioalkyl group, a thioaryl group, an arylsulfonyl group, an alkylsulfonyl group, an amino group, an alkylamino group, an arylamino group, a hydroxy group, an alkoxy group, an acylamino group, an acyloxy group, a phenyl group, a carboxy group, a carboxyamide group, a carboalkoxy group, an acyl group, a sulfonyl group, a cyano group, and a nitro group, any adjacent ones of R8 to R19 are optionally part of a condensed aliphatic ring or a condensed aromatic ring, the condensed aliphatic ring or the condensed aromatic ring optionally includes one or more atoms other than carbon, M is one of boron and a divalent or trivalent metal, and X is an anionic group.

16. The photoelectric conversion element according to claim 1, wherein the second organic semiconductor material is a subphthalocyanine derivative, and the third organic semiconductor material is a quinacridone derivative.

17. The photoelectric conversion element according to claim 1, wherein the second organic semiconductor material is a subphthalocyanine derivative and the third organic semiconductor material is a triallylamine derivative or a benzothienobenzothiophene derivative.

18. The photoelectric conversion element according to claim 1, wherein the fullerene is represented by one of the following formulas (5) and (6):

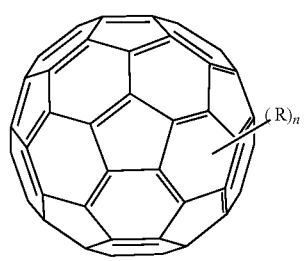
(5)

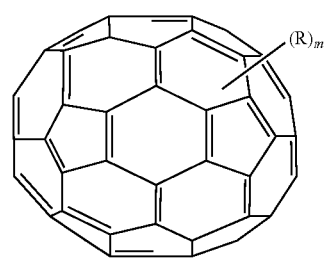
(6)

where each R is a hydrogen atom.

19. The photoelectric conversion element according to claim 1, wherein the photoelectric conversion layer includes a fourth organic semiconductor material having a same mother skeleton as a mother skeleton of one of the first organic semiconductor material, the second organic semiconductor material, and the third organic semiconductor material, and having a different substituent.

20. The photoelectric conversion element according to claim 1, wherein the visible light region is in a range from 450 nm to 800 nm, both inclusive.

21. A light detecting device provided with pixels, each including one or more organic photoelectric converters, each of the organic photoelectric converters comprising:
a first electrode and a second electrode facing each other; and
a photoelectric conversion layer provided between the first electrode and the second electrode, and including a first organic semiconductor material, a second organic semiconductor material, and a third organic semiconductor material that have mother skeletons different from one another,
wherein the first organic semiconductor material is fullerene,
wherein the second organic semiconductor material in a form of a single-layer film has a linear absorption coefficient of a maximal light absorption wavelength in a visible light region higher than a linear absorption coefficient of a maximal light absorption wavelength in the visible light region of a single-layer film of the first organic semiconductor material and a linear absorption coefficient of a maximal light absorption wavelength in the visible light region of a single-layer film of the third organic semiconductor material, wherein the third organic semiconductor material is a hole-transporting material; and wherein the linear absorption coefficient of the maximal light absorption wavelength in the visible light region of the second organic semiconductor material is more than ten times a linear absorption coefficient of a wavelength with 450 nm of the second organic semiconductor material.

22. The light detecting device according to claim 21, wherein the one or more organic photoelectric converters, and one or more inorganic photoelectric converters that perform photoelectric conversion in a wavelength region different from a wavelength region of the organic photoelectric converters, are stacked in each of the pixels.

23. The light detecting device according to claim 22, wherein the one or more inorganic photoelectric converters are formed to be embedded in a semiconductor substrate, and wherein the one or more organic photoelectric converters are formed on a first surface side of the semiconductor substrate.

24. The light detecting device according to claim 23, wherein the one or more organic photoelectric converters perform photoelectric conversion on green light, and wherein an inorganic photoelectric converter that performs photoelectric conversion on blue light and an inorganic photoelectric converter that performs photoelectric conversion on red light are stacked in the semiconductor substrate.

* * * * *